(12) United States Patent
McNeil et al.

(10) Patent No.: US 11,726,107 B2
(45) Date of Patent: Aug. 15, 2023

(54) INERTIAL SENSOR SAMPLING WITH COMBINED SENSE AXES

(71) Applicant: NXP USA, Inc., Austin, TX (US)

(72) Inventors: Andrew C McNeil, Chandler, AZ (US); Jerome Romain Enjalbert, Tournefeuille (FR); Joel Cameron Beckwith, Tokyo (JP); Jun Tang, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 312 days.

(21) Appl. No.: 17/027,948

(22) Filed: Sep. 22, 2020

(65) Prior Publication Data

US 2021/0123946 A1    Apr. 29, 2021

(30) Foreign Application Priority Data

Oct. 29, 2019 (EP) .................................... 19306408

(51) Int. Cl.
*G01P 15/125* (2006.01)
*B81B 3/00* (2006.01)

(52) U.S. Cl.
CPC .......... *G01P 15/125* (2013.01); *B81B 3/0027* (2013.01); *B81B 2201/0228* (2013.01)

(58) Field of Classification Search
CPC .................................................... G01P 15/125
USPC ...................................................... 73/514.01
See application file for complete search history.

(56) References Cited

U.S. PATENT DOCUMENTS

| 8,173,470 | B2 | 5/2012 | Mehregany |
| 10,393,768 | B2 | 8/2019 | Thompson et al. |
| 2005/0235751 | A1* | 10/2005 | Zarabadi ............. G01P 15/0802 73/514.01 |
| 2010/0132463 | A1* | 6/2010 | Caminada .......... G01C 19/5712 73/504.12 |
| 2013/0006559 | A1* | 1/2013 | Grosjean ............... G01P 15/125 702/65 |
| 2015/0268269 | A1 | 9/2015 | Jia et al. |
| 2016/0274141 | A1 | 9/2016 | Enjalbert |
| 2018/0335444 | A1 | 11/2018 | Cassagnes et al. |

FOREIGN PATENT DOCUMENTS

EP     2236981 A1     10/2010

* cited by examiner

*Primary Examiner* — Walter L Lindsay, Jr.
*Assistant Examiner* — Philip T Fadul

(57) ABSTRACT

A sensor system includes a transducer for sensing a physical stimulus along at least two orthogonal axes and an excitation circuit. The transducer includes a movable mass configured to react to the physical stimulus and multiple differential electrode pairs of electrodes. Each of the electrode pairs is configured to detect displacement of the movable mass along one of the orthogonal axes. The excitation circuit is connectable to the electrodes in various electrode connection configurations, with different polarity schemes, that enable excitation and sampling of each of the orthogonal axes during every sensing period. For each sensing period, a composite output signal is produced that includes the combined information sensed along each of the orthogonal axes. The individual sense signals for each orthogonal axis may be extracted from the composite output signals.

14 Claims, 7 Drawing Sheets

PRIOR ART

*FIG. 9*
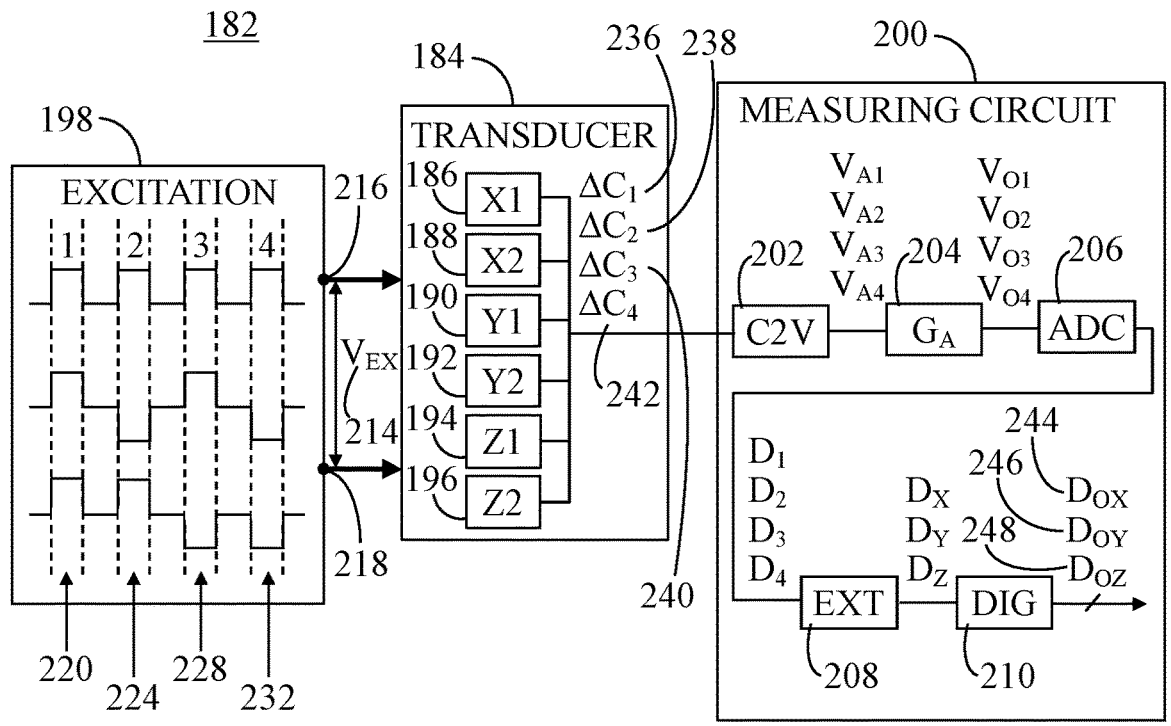
*FIG. 10*
| | PERIOD | MEASURE | T1 | T2 | |
|---|---|---|---|---|---|
| 220 | 1 | $\Delta C_1$ | X1, Y1, Z1 | X2, Y2, Z2 | ←222 |
| 224 | 2 | 236 $\Delta C_2$ | X1, Y2, Z1 | X2, Y1, Z2 | ←226 |
| 228 | 3 | $\Delta C_3$ 238 | X1, Y1, Z2 | X2, Y2, Z1 | ←230 |
| 232 | 4 | 240 $\Delta C_4$ | X1, Y2, Z2 | X2, Y1, Z1 | ←234 |
212
*FIG. 11*
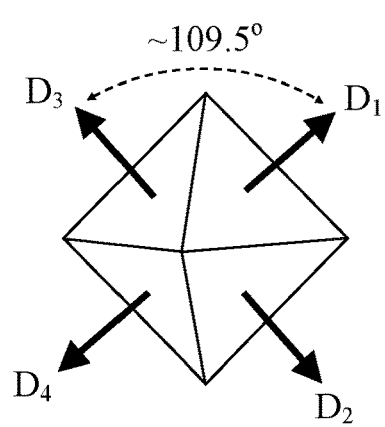

INERTIAL SENSOR SAMPLING WITH COMBINED SENSE AXES

CROSS-REFERENCE TO RELATED APPLICATIONS

This application claims the priority under 35 U.S.C. § 119 of European patent application no. 19306408.6, filed Oct. 29, 2019 the contents of which are incorporated by reference herein.

TECHNICAL FIELD OF THE INVENTION

The present invention relates generally to the field of microelectromechanical systems (MEMS) transducer devices. More specifically, the present invention relates to multiple axis inertial sensor sampling by combining sense axes.

BACKGROUND OF THE INVENTION

Microelectromechanical systems (MEMS) sensors are widely used in applications such as automotive, inertial guidance systems, household appliances, protection systems for a variety of devices, and many other industrial, scientific, and engineering systems. Such MEMS sensors are used to sense a physical stimulus such as acceleration, pressure, angular rotation, or temperature, and to provide an electrical signal representative of the sensed physical condition. Challenges for developers of MEMS sensors, such as capacitive transducers include improving the noise performance (e.g., achieve a higher signal-to-noise ratio) while concurrently decreasing price and decreasing transducer size.

SUMMARY

Aspects of the disclosure are defined in the accompanying claims.

In a first aspect, there is provided a sensor system comprising a transducer configured to sense a physical stimulus along a first axis and a second axis, the second axis being orthogonal to the first axis. The transducer includes a movable mass configured to react to the physical stimulus, first and second electrodes that are immovable relative to the movable mass, the first and second electrodes being configured as a first differential electrode pair for detecting a first displacement of the movable mass along the first axis in response to the physical stimulus, and third and fourth electrodes that are immovable relative to the movable mass, the third and fourth electrodes being configured as a second differential electrode pair for detecting a second displacement of the movable mass along the second axis in response to the physical stimulus. The sensor system further includes an excitation circuit selectively connectable to the first, second, third, and fourth electrodes and configured to provide an excitation voltage, wherein during a first sensing period, a first terminal of the excitation circuit is coupled to the first and third electrodes and a second terminal of the excitation circuit is coupled to the second and fourth electrodes in a first connection configuration, and during a second sensing period, the first terminal of the excitation circuit is coupled to the first and fourth electrodes and the second terminal of the excitation circuit is coupled to the second and third electrodes in a second connection configuration.

In a second aspect, there is provided a method for measuring a physical stimulus using a system that includes a transducer configured to sense the physical stimulus along a first axis and a second axis, the second axis being orthogonal to the first axis, the transducer including a movable mass configured to react to the physical stimulus, first and second electrodes that are immovable relative to the movable mass, the first and second electrodes being configured as a first differential electrode pair for detecting a first displacement of the movable mass along the first axis in response to the physical stimulus, and third and fourth electrodes that are immovable relative to the movable mass, the third and fourth electrodes being configured as a second differential electrode pair for detecting a second displacement of the movable mass along the second axis in response to the physical stimulus. The method comprises implementing an excitation circuit to provide an excitation voltage; during a first sensing period, coupling a first terminal of the excitation circuit to the first and third electrodes and a second terminal of the excitation circuit to the second and fourth electrodes; during a second sensing period, coupling the first terminal of the excitation circuit to the first and fourth electrodes and the second terminal of the excitation circuit to the second and third electrodes; receiving a first and second composite output signals from the transducer at a measuring circuit, the first composite output signal representing the first displacement of the movable mass along the first axis combined with the second displacement of the movable mass along the second axis during the first sensing period and the second composite output signal representing the first displacement of the movable mass along the first axis combined with the second displacement of the movable mass along the second axis during the second sensing period; and concurrently utilizing the first and second composite output signals to extract a first sense signal indicative of the first displacement of the movable mass and to extract a second sense signal indicative of the second displacement of the movable mass.

In a third aspect, there is provided a sensor system comprising a transducer configured to sense a physical stimulus along a first axis and a second axis, the second axis being orthogonal to the first axis. The transducer includes a movable mass configured to react to the physical stimulus; first and second electrodes that are immovable relative to the movable mass, the first and second electrodes being configured as a first differential electrode pair for detecting a first displacement of the movable mass along the first axis in response to the physical stimulus, the transducer being configured to produce a first signal component between the movable mass and the first electrode and a second signal component between the movable mass and the second electrode; and third and fourth electrodes that are immovable relative to the movable mass, the third and fourth electrodes being configured as a second differential electrode pair for detecting a second displacement of the movable mass along the second axis in response to the physical stimulus, the transducer being configured to produce a third signal component between the movable mass and the third electrode and a fourth signal component between the movable mass and the fourth electrode. The system further comprises an excitation circuit selectively connectable to the first, second, third, and fourth electrodes and configured to provide an excitation voltage, wherein during a first sensing period, a first terminal of the excitation circuit is coupled to the first and third electrodes and a second terminal of the excitation circuit is coupled to the second and fourth electrodes such that the transducer produces a first composite output signal representing the first displacement of the movable mass along the first axis combined with the second displacement of the movable mass along the second axis during the first sensing period, the first composite output signal being proportional to a summation of the first and third signal components subtracted by a summation of the second and fourth signal components; and during a second sensing period, the first terminal of the excitation circuit is coupled to the first and fourth electrodes and the second terminal of the excitation circuit is coupled to the second and third electrodes such that the transducer produces a second composite output signal representing the first displacement of the movable mass along the first axis combined with the second displacement of the movable mass along the second axis during the second sensing period, the second composite output signal being proportional to a summation of the first and fourth signal components subtracted by a summation of the second and third signal components. The system further comprises a measuring circuit electrically coupled with the transducer for measuring the first composite output signal from the transducer responsive to the excitation voltage during the first sensing period and for measuring the second composite output signal from the transducer responsive to the excitation voltage during the second sensing period.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

FIG. 9 shows a partial block diagram of a system that includes a three-axis transducer in accordance with another embodiment;

FIG. 10 shows a table demonstrating multiple sensing periods in connection with a three-axis transducer;

FIG. 11 shows an illustrative representation of the "axes" being sampled by mathematical abstraction resulting from combined excitation of the three-axis transducer of FIG. 9.

DETAILED DESCRIPTION

In overview, the present disclosure concerns systems and methodology for combined sampling of the multiple sense axes of an inertial sensor, such as a microelectromechanical systems (MEMS) capacitive accelerometer. More particularly, systems and methodology entail providing electrodes of a transducer with an excitation voltage in such a way that information from all orthogonal sense axes is contained in a composite output signal from the transducer during each measurement cycle (e.g., sensing period). The composite output signal may then be converted into standard (Cartesian) axis values. The inclusion of sense information of every axis in every sensing period may yield significant improvements in signal-to-noise ratio (SNR) without a significant increase in current consumption. Additionally, the combined sense axis sampling technique can be implemented on any of a variety of multiple sense axis inertial sensor designs. Therefore, improvements in SNR may be achieved without increasing the inertial sensor die size, without changing the structure of the inertial sensor configuration, and without a significant increase in current consumption. The description provided below relates to a capacitive transducer in the form of a MEMS capacitive accelerometer. It should be appreciated, however, that embodiments described below may be generalized to other capacitive transducers, circuits, and components, such as, for example, gyroscopes.

The instant disclosure is provided to further explain in an enabling fashion at least one embodiment in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued. It should be understood that the use of relational terms, if any, such as first and second, top and bottom, and the like are used solely to distinguish one from another entity or action without necessarily requiring or implying any actual such relationship or order between such entities or actions.

Figure 1:
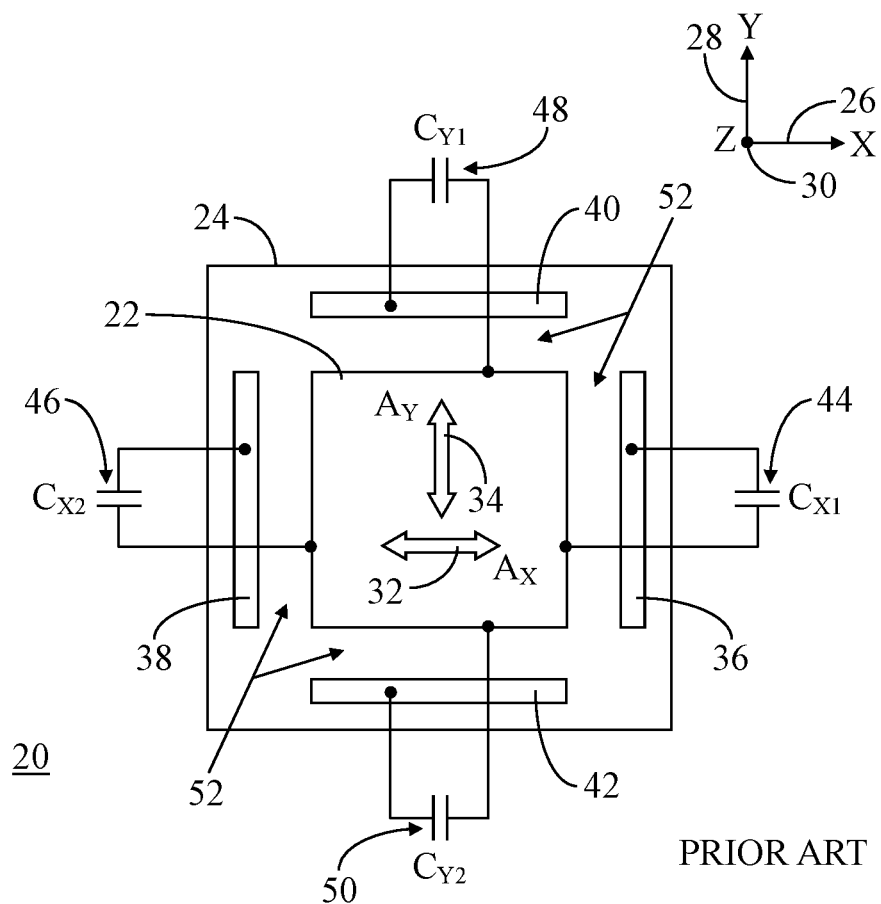
FIG. 1 shows a simplified plan view of a prior art microelectromechanical systems (MEMS) capacitive transducer.

Referring to FIG. 1, FIG. 1 shows a simplified plan view of a prior art microelectromechanical systems (MEMS) capacitive transducer 20. In this example, capacitive transducer 20 is a MEMS capacitive accelerometer. As such, capacitive transducer 20 may alternatively be referred to herein as accelerometer 20.

Accelerometer 20 generally includes a movable mass 22 spaced apart from and movably coupled to a substrate 24 through spring elements (not shown for simplicity). In this example, the spring elements may enable translational motion of movable mass 22 in a first direction substantially parallel to an X-axis 26 (rightward/leftward on the page) and in a second direction substantially parallel to a Y-axis 28 (upward/downward on the page) in a three-dimensional coordinate system that additionally includes a Z-axis 30 (directed into and out of the page). That is, the spring elements enable translational motion of movable mass 22 in response to an acceleration force 32, labeled $A_X$, imposed on accelerometer 20 in a direction that is substantially parallel to X-axis 26 and in response to an acceleration force 34, labeled $A_Y$, imposed on accelerometer 20 in a direction that is substantially parallel to Y-axis 28.

The translational motion of movable mass 22 in response to acceleration forces 32, 34 can be detected as a change in capacitance between certain electrodes. By way of example, accelerometer 20 includes first and second electrodes 36, 38 mechanically coupled to, but electrically isolated from, substrate 24. First and second electrodes 36, 38 are positioned proximate movable mass 22 and are configured as a differential electrode pair for detecting displacement of movable mass 22 along X-axis 26 in response to acceleration force 32. Third and fourth electrodes 40, 42 are positioned proximate movable mass 22 and are configured as a differential electrode pair for detecting displacement of movable mass 22 along Y-axis 28 in response to acceleration force 34. Thus, first, second, third, and fourth electrodes 36, 38, 40, 42 are immovable relative to movable mass 22. As such, first, second, third, and fourth electrodes 36, 38, 40, 42 may be considered "fixed" electrodes and movable mass 22, or structures extending from movable mass 22, may be considered "movable" electrode(s).

In a structure of this type, charge may be injected into accelerometer 20 through a differential excitation voltage, $V_{EX}$, applied between first and second electrodes 36, 38 of accelerometer 20 during a sensing period. Alternatively, the differential excitation voltage may be applied between third and fourth electrodes 40, 42 during a different sensing period. The excitation voltage is the magnitude of the voltage, i.e., the voltage difference between the minimum and maximum voltages connected to first and second electrodes 36, 38 or alternatively connected to third and fourth electrodes 40, 42.

First, second, third, and fourth capacitors 44, 46, 48, 50 are effectively formed between the fixed first, second, third, and fourth electrodes 36, 38, 40, 42 and movable mass 22 (or structures extending from movable mass 22). That is, capacitor gaps 52 are thus formed between movable mass 22 and each of first, second, third, and fourth electrodes 36, 38, 40, 42. The excitation voltage applied to accelerometer 20 charges capacitors 44, 46, 48, 50. When movable mass 22 displaces in response either of acceleration forces 32, 34, the width of capacitor gaps 52 change which in turn causes the capacitance (labeled $C_{X1}$, $C_{X2}$, $C_{Y1}$, $C_{Y2}$) of capacitors 44, 46, 48, 50 to change. Movable mass 22 moves commensurate with the magnitude of acceleration force 32 such that the larger the magnitude of acceleration force 32, the more movable mass 22 will move toward an extreme position and the larger the differential charge output responsive to acceleration force 32 along X-axis 26 will be. Similarly, movable mass 22 also moves commensurate with the magnitude of acceleration force 34 such that the larger the magnitude of acceleration force 34, the more movable mass 22 will move toward an extreme position and the larger the differential charge output responsive to acceleration force 34 along Y-axis 26 will be.

In this prior art configuration, each sense axis is sensed separately and sequentially. For example, in order to enable X-axis sensing, the excitation voltage is applied on first and second electrodes 36, 38 while a rest voltage is applied on third and fourth electrodes 40, 42. A differential capacitance, or a change in capacitance representing acceleration force 32, $A_X$ can be expressed as follows:

$$\Delta C_X = C_{X1} - C_{X2} \quad (1)$$

Likewise, in this prior art configuration, in order to enable Y-axis sensing, the excitation voltage is applied on third and fourth electrodes 40, 42 while the rest voltage is applied on first and second electrodes 36, 38. A differential capacitance, or a changing in capacitance representing the sensitivity of accelerometer 20 to acceleration force 34, $A_Y$, can be expressed as follows:

$$\Delta C_Y = C_{Y1} - C_{Y2} \quad (2)$$

Figure 2:
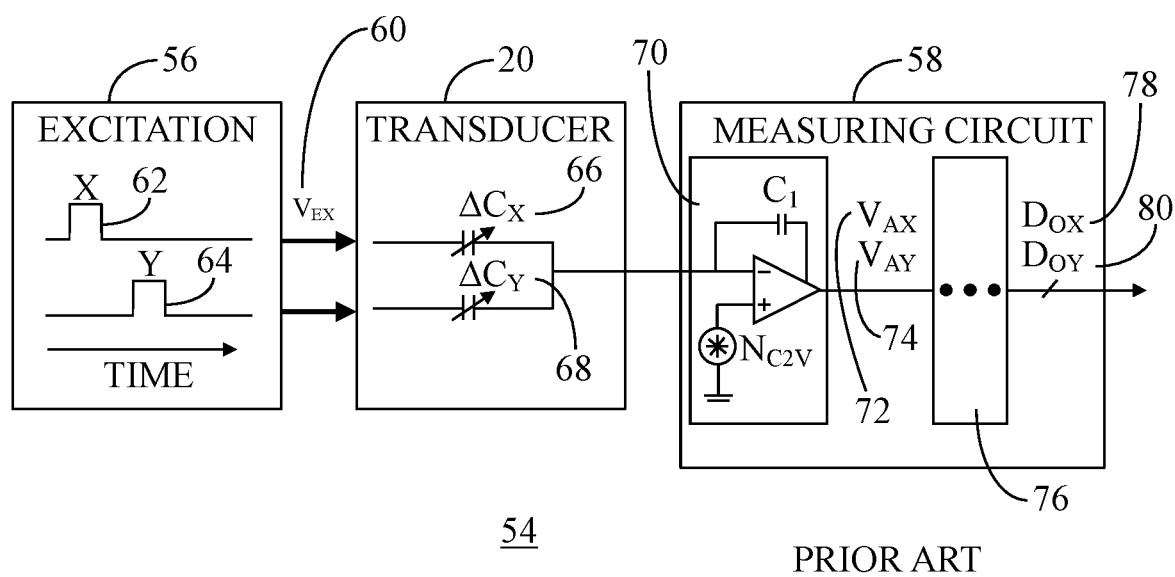
FIG. 2 shows a block diagram of a prior art system that includes the MEMS capacitive transducer.

Referring to FIG. 2 in connection with FIG. 1, FIG. 2 shows a block diagram of a prior art system 54 that includes capacitive transducer 20. In this prior art example, system 54 includes an excitation circuit 56 configured excite accelerometer 20 and a measuring circuit 58 for measuring results from the excitation. In particular, an excitation voltage 60, $V_{EX}$, is applied between first and second electrodes 36, 38 during a first sensing period 62. Thereafter, excitation voltage 60 is applied between third and fourth electrodes 40, 42 during a second sensing period 64. This alternating sequence of the provision of excitation voltage 60 may occur over a plurality of sensing periods relative to time. Accelerometer 20 and measuring circuit 58 are electrically coupled to convey the excitation results, e.g., a first capacitance, $\Delta C_X$, 66 (a first differential charge component as a difference between the capacitances, $C_{X1}$ and $C_{X2}$) and a second capacitance, $\Delta C_Y$, 68 (a second differential charge component as a difference between the capacitances, $C_{Y1}$ and $C_{Y2}$), from accelerometer 20 to measuring circuit 58. That is, if the change in capacitance for one of capacitors capacitances, $C_{X1}$ and $C_{X2}$ is $\Delta C/2$, then the output per axis is $\Delta C$.

Measuring circuit 58 generally includes a signal chain used to process first and second capacitances 66, 68 from accelerometer 20 to yield signals representative of each of acceleration forces 32, 34. A first stage of the signal chain includes a capacitance-to-voltage converter stage 70, abbreviated C2V herein, which sequentially receives first and second capacitances 66, 68 from accelerometer 20. C2V 70 converts first capacitance 66 to a first analog output voltage 72, VAX, representative of acceleration force 32 and converts second capacitance 68 to a second analog output voltage 74, $V_{AY}$. The subsequent stages of measuring circuit 58 are represented by a block 76. The subsequent stages of measuring circuit 58 may include a gain stage for sequentially receiving first and second analog output voltages 72, 74. At the gain stage, a gain value and/or an offset trim value may be applied to first and second analog output voltages 72, 74. An analog-to-digital converter (ADC) may follow the gain stage. The ADC converts the amplified and trimmed first and second analog output voltages 72, 74 into digital code. The digital code may be further processed by digital logic and digital trim. Thus, the output of measuring circuit 58 may be, for example, a first digital output signal 78, $D_{OX}$, representing acceleration force 32 along X-axis 26 and a second digital output signal 80, $D_{OY}$, representing acceleration force 34 along Y-axis 28. Of course, other processing circuitry may be included within processing block 76 that is not described herein for brevity.

An input signal to the ADC representing acceleration force 32 along X-axis 26 may be characterized as follows:

$$V_{OX} = V_{EX} \times \frac{\Delta C_X}{C_1} \times G_X \quad (3)$$

At a product output, first digital output signal 78 may be characterized as follows:

$$D_{OX} = V_{OX} \times G_{ADC} \times G_{DIGX} \quad (4)$$

Combining equation (3) into equation (4) yields the following:

$$D_{OX} = V_{EX} \times \frac{\Delta C_X}{C_1} \times G_X \times G_{ADC} \times G_{DIGX} \quad (5)$$

An input signal to the ADC representing acceleration force 34 along Y-axis 28 may be characterized as follows:

$$V_{OY} = V_{EX} \times \frac{\Delta C_Y}{C_1} \times G_Y \quad (6)$$

At a product output, second digital output signal 80 may be characterized as follows:

$$D_{OY} = V_{OY} \times G_{ADC} \times G_{DIGY} \quad (7)$$

Combining equation (3) into equation (4) yields the following:

$$D_{OY} = V_{EX} \times \frac{\Delta C_Y}{C_1} \times G_Y \times G_{ADC} \times G_{DIG} \quad (8)$$

In the above equations, $G_X$ and $G_Y$ represent analog gain values imposed on first and second output voltages 72, 74 output from C2V 70, $G_{ADC}$ represents a gain imposed on the signals from the ADC, and $G_{DIGX}$ and $G_{DIGY}$ represent digital gain values imposed on the signals following digitization of the signals. For each sense axis (e.g., X-axis 26 and Y-axis 28 in this example) the analog gain (e.g., $G_X$ and $G_Y$) is set such that the ADC input range is fully utilized under a full scale acceleration, which creates $\Delta C|_{FS}$. $G_{dig}$ is set to reach a specified product sensitivity given the ADC gain, $G_{ADC}$ and the sensitivity of accelerometer 20 for each of X-axis 26 and Y-axis 28.

In general, noise is dominated by the thermal noise of C2V 70. The amplification of this thermal noise depends on the total capacitance, $C_m$, loading the input of C2V 70, which is the total capacitance attached to movable mass 22. The noise with respect to X-axis sensing can be characterized as follows:

$$N_{V_{OX}} = N_{C2V} \times \left(1 + \frac{C_m}{C_1}\right) \times G_X \quad (9)$$

$$N_{D_{OX}} = N_{C2V} \times \left(1 + \frac{C_m}{C_1}\right) \times G_X \times G_{ADC} \times G_{DIGX} \quad (10)$$

Thus, the signal-to-noise ratio (SNR) can be characterized as follows:

$$SNR = \frac{D_{OX}}{N_{D_{OX}}} = \frac{V_{EX}}{N_{C2V}} \times \frac{\Delta C_X}{C_m + C_1} \quad (11)$$

The noise with respect to Y-axis sensing can be characterized as follows:

$$N_{V_{OY}} = N_{C2V} \times \left(1 + \frac{C_m}{C_1}\right) \times G_Y \quad (12)$$

$$N_{D_{OY}} = N_{C2V} \times \left(1 + \frac{C_m}{C_1}\right) \times G_Y \times G_{ADC} \times G_{DIGY} \quad (13)$$

Thus, the signal-to-noise ratio (SNR) can be characterized as follows:

$$SNR = \frac{D_{OY}}{N_{D_{OY}}} = \frac{V_{EX}}{N_{C2V}} \times \frac{\Delta C_Y}{C_m + C_1} \quad (14)$$

Embodiments described below enable better noise performance (e.g., higher SNR) than prior art designs such as system 54 implementing a multiple sense axis accelerometer 20. In particular, transducer electrodes are excited in such a way that information from all orthogonal sense axes is contained in a composite output signal from the transducer during each measurement cycle (e.g., sensing period). The composite output signal may then be converted into standard (Cartesian) axis values. The inclusion of sense information of every axis in every sensing period may yield significant improvements in signal-to-noise ratio (SNR) without a significant increase in current consumption and without making the transducer die larger.

Figure 3:
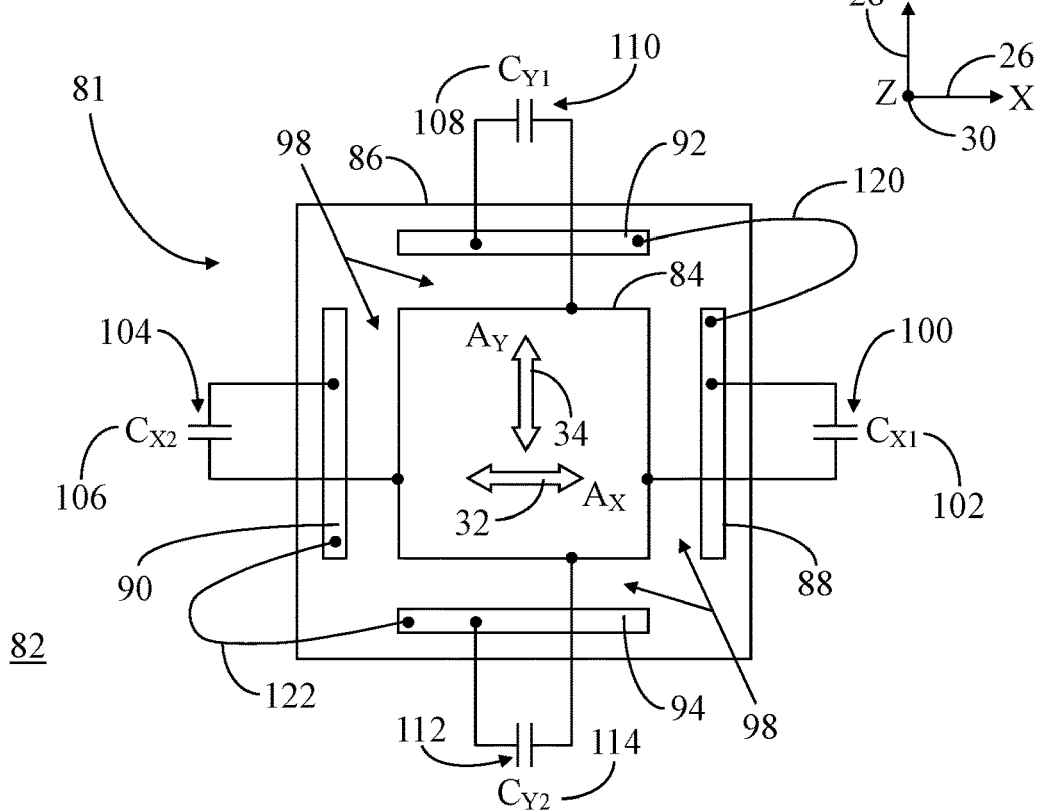
FIG. 3 shows a simplified plan view of an electrode connection configuration during a sensing period for a dual axis capacitive transducer in accordance with an embodiment.
Figure 4:
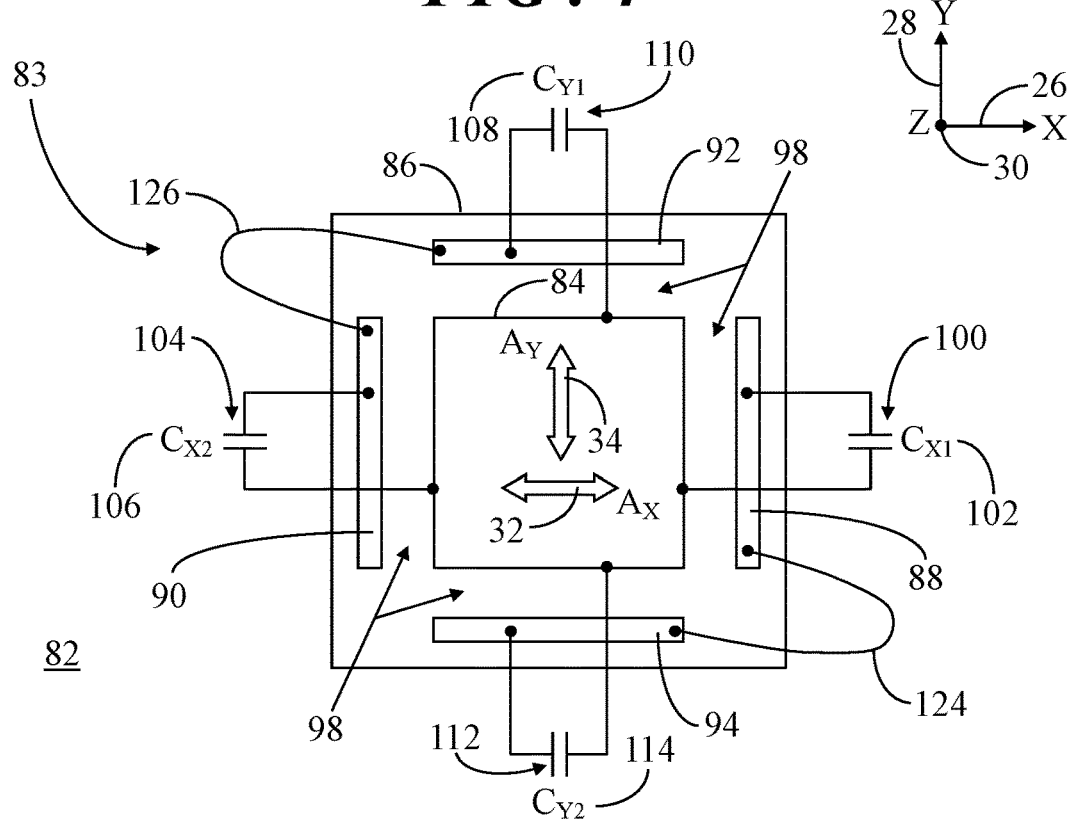
FIG. 4 shows a simplified plan view of another electrode connection configuration during another sensing period for the dual axis capacitive transducer of FIG. 3.

Referring now to FIGS. 3 and 4, FIG. 3 shows a simplified plan view of an electrode connection configuration 81 during a sensing period for a dual axis capacitive transducer 82 in accordance with an embodiment and FIG. 4 shows a simplified plan view of another electrode connection configuration 83 during another sensing period for dual axis capacitive transducer 82. For simplicity, transducer 82 is illustrated as being similar to accelerometer 20 (FIG. 1) and may thus be referred to herein as accelerometer 82. However, it will become readily apparent embodiments described herein entail an electrode connection scheme and combined axis sensing architecture that can be used with any multiple sense axis inertial sensor design that may have one or more movable masses and may be able to sense a physical stimulus along two or three orthogonal axes, where the two or three orthogonal axes may be any combination of X-axis 26, Y-axis 28, and/or Z-axis 30.

Accelerometer 82 is configured to sense a physical stimulus along a first axis and a second axis, the second axis being orthogonal to the first axis. Accordingly, in this example, accelerometer 82 is configured to sense acceleration force 32 along X-axis 26 and acceleration force 34 along Y-axis 28. Accelerometer 82 generally includes a movable mass 84 spaced apart from and movably coupled to a substrate 86 through spring elements (not shown for simplicity). In this example, the spring elements may enable a first displacement of movable mass 84 (e.g., translational motion) along X-axis 26 in response to acceleration force 32 and a second displacement of movable mass 84 (e.g., translational motion) along Y-axis 28 in response to acceleration force 34.

The translational motion of movable mass 84 in response to acceleration forces 32, 34 can be detected as a change in capacitance between certain electrodes. By way of example, accelerometer 82 includes first and second electrodes 88, 90 mechanically coupled to, but electrically isolated from, substrate 86. First and second electrodes 88, 90 are positioned proximate movable mass 84 and are configured as a first differential electrode pair for detecting displacement of movable mass 84 along X-axis 26 in response to acceleration force 32. Third and fourth electrodes 92, 94 are positioned proximate movable mass 84 and are configured as a second differential electrode pair for detecting displacement of movable mass 84 along Y-axis 28 in response to acceleration force 34.

First, second, third, and fourth electrodes 88, 90, 92, 94 are immovable relative to movable mass 84. As such, first, second, third, and fourth electrodes 88, 90, 92, 94 may be considered "fixed" electrodes and movable mass 84 (or structures extending from movable mass 84) may be considered "movable" electrode(s). Some transducer architectures may include a multiplicity of movable finger structures extending from an exterior or interior periphery of movable mass 84. Other transducer architectures may have openings extending through the movable mass, with the multiple fixed electrodes being positioned within the openings. Accordingly, for simplicity movable mass 84 may be referred to herein as the "movable" electrode relative to the "fixed" first, second, third, and fourth electrodes 88, 90, 92, 94. Further, first, second, third, and fourth electrodes 88, 90, 92, 94 are shown in singular form. However, each illustrated electrode 88, 90, 92, 94 may represent one or multiple electrodes.

In some embodiments, first and second electrodes 88, 90 are arranged parallel to one another, third and fourth electrodes 92, 94 are arranged parallel to one another, and third and fourth electrodes 92, 94 are arranged orthogonal to first and second 88, 90. In some embodiments, accelerometer 82 is a capacitive accelerometer, and first, second, third, and fourth electrodes 88, 90, 92, 94 are spaced apart from movable mass 84 by capacitor gaps 98. Movable mass 84 and first electrode 88 are configured to establish a first capacitor 100 having a first signal component, e.g., a first capacitance 102, $C_{X1}$. Similarly, movable mass 84 and second electrode 90 are configured to establish a second capacitor 104 having a second signal component, e.g., a second capacitance 106, $C_{X2}$. Movable mass 84 and third electrode 92 are configured to establish a third capacitor 108 having a third signal component, e.g., a third capacitance 110, $C_{Y1}$. And, movable mass 84 and fourth electrode 94 are configured to establish a fourth capacitor 112 having a fourth signal component, e.g., a fourth capacitance 114, $C_{Y2}$.

When movable mass 84 displaces in response either of acceleration forces 32, 34, the width of capacitor gaps 98 change which in turn causes capacitances 102, 106, 110, 114 of capacitors 100, 104, 108, 112 to change. More particularly, in the differential pair configurations, the first displacement of movable mass 84 along X-axis 26 changes first capacitance 102. Additionally, the first displacement of movable mass 84 along X-axis changes second capacitance 106 in an opposite direction with respect to first capacitance 102. Likewise, the second displacement of movable mass 84 along Y-axis 28 changes third capacitance 110, and the second displacement of movable mass 84 along Y-axis changes fourth capacitance 114 in an opposite direction with respect to third capacitance 110.

Capacitive accelerometer 82 is provided for illustrative purposes herein. It should be understood that one or more movable masses of a capacitive transducer can encompass a great variety of shapes and configurations capable of multiple axis sensing. Further, only a few fixed and movable electrodes are shown for simplicity of illustration. Those skilled in the art will recognize that the quantity and/or configuration of the fixed and movable electrodes can vary in accordance with a particular design. Indeed, although the fixed electrodes are represented as being external to the movable mass for simplicity of illustration, a great variety of fixed and movable electrodes are internal to the movable masses so as to be more robust in terms of package stress and impact shock. Still further, although a capacitive accelerometer 82 is discussed herein, embodiments described below may be generalized to other capacitive transducers, circuits, and components, such as, for example, gyroscopes.

Figure 5:
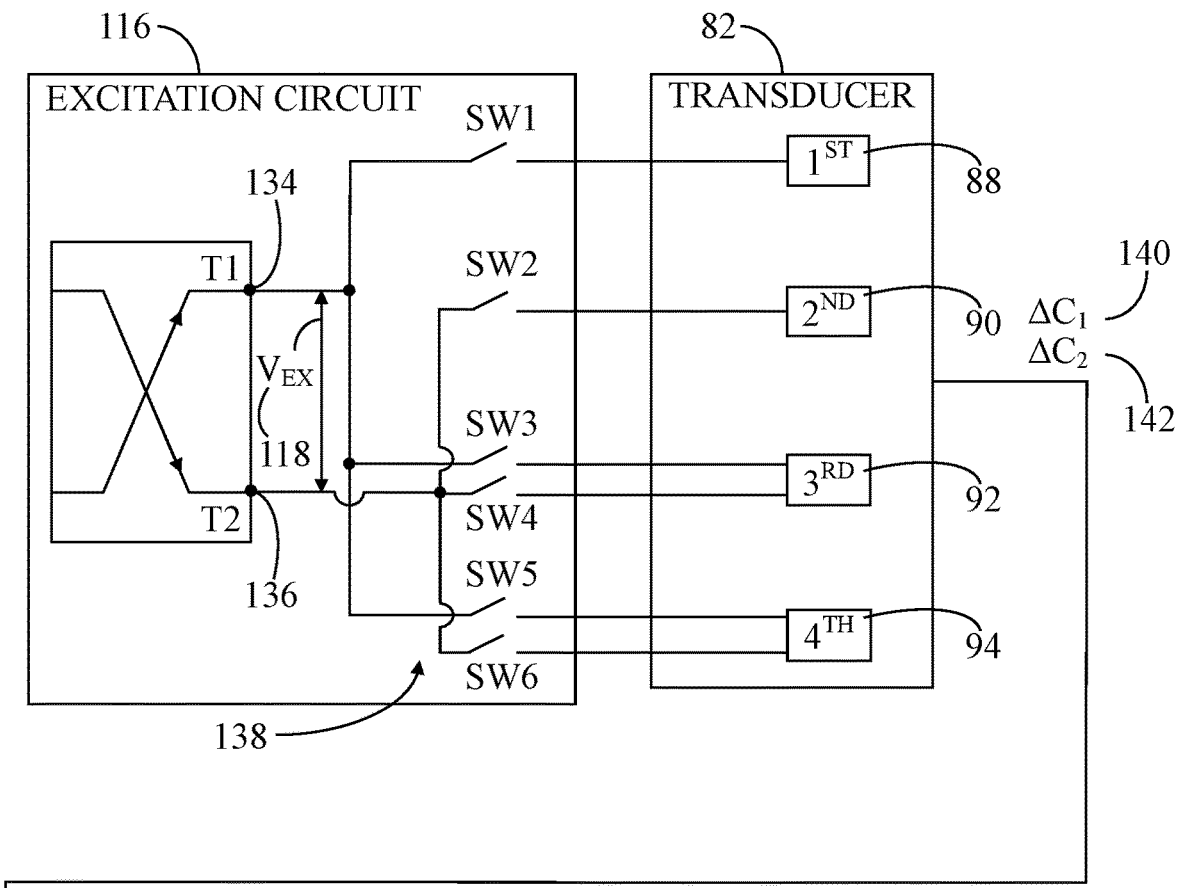
FIG. 5 shows a block diagram of a sensor system that includes the capacitive transducer of FIGS. 3-4.
Figure 5:
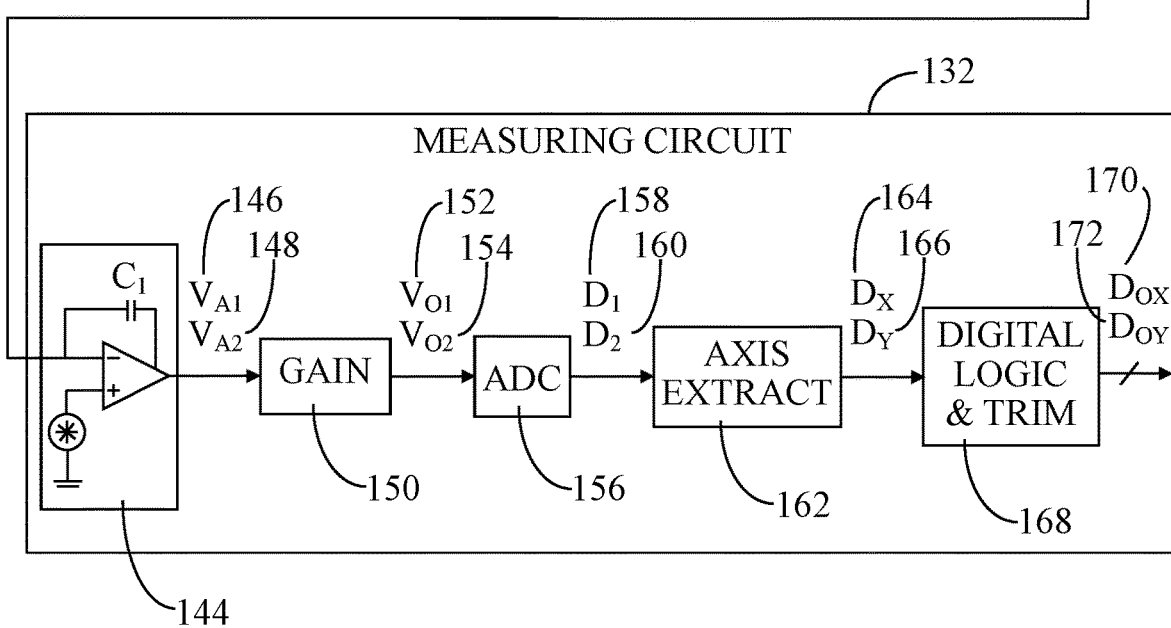

In accordance with an embodiment, an excitation circuit 116 (see FIG. 5) is selectively connectable to first, second, third, and fourth electrodes 88, 90, 92, 94 and is configured to provide an excitation voltage 118 (see FIG. 5). During a first sensing period, shown in FIG. 3, a first and third electrodes 88 and 92 are electrically connected to one another via excitation circuit 116, pictorially represented by a connection 120, and second and fourth electrodes 90, 94 are electrically connected to one another via excitation circuit 116, pictorially represented by a connection 122 in connection configuration 81. During a second sensing period shown in FIG. 4, first and fourth electrodes 88, 94 are electrically connected to one another via excitation circuit 116, pictorially represented by a connection 124, and second and third electrodes 90, 92 are electrically connected to one another via excitation circuit 116, pictorially represented by a connection 126 in connection configuration 83.

It should be understood that connections 120, 122, 124, 126 are not physical wires connecting the various electrodes. Rather, the illustrated connections 120, 122, 124, 126 are symbolic in that the voltages driving these electrodes from excitation circuit 116 will be identical at different times depending upon the configurations. The electrical connection of first, second, third, and fourth electrodes 88, 90, 92, 94 to one another and to excitation circuit 116 will be described in greater detail below.

Referring now to FIG. 5 in connection with FIGS. 3 and 4, FIG. 5 shows a block diagram of a sensor system 130 that includes a transducer. In this embodiment, the transducer may be capacitive accelerometer 82 of FIGS. 3-4. However, in alternative embodiments, a wide variety of multiple sense axis transducers may be implemented within sensor system 130.

Sensor system 130 includes excitation circuit 116 configured to excite accelerometer 82 and a measuring circuit 132 for measuring the results from the excitation. Excitation circuit 116 may be a direct current (DC) voltage source, a charge pump, or any other suitable circuit for providing excitation voltage 118. Excitation circuit 116 includes a first node, referred to herein as a first terminal 134 (labeled T1) and a second node, referred to herein as a second terminal 136 (labeled T2). In some embodiments, excitation voltage 118 is the differential voltage between first and second terminals 134, 136, where second terminal 136 may be connected to ground or another suitable reference voltage.

As mentioned above, excitation circuit 116 is selectively connectable to first, second, third, and fourth electrodes 88, 90, 92, 94. Thus, excitation circuit 116 may further include switching circuitry 138 which may be implanted in an application specific integrated circuit (ASIC) as hardware, software, or a combination of hardware and software. Simple switches (labeled SW1 through SW6) are shown in switching circuitry 138 to visualize the connection of first and second terminals 134, 136 of excitation circuit 116 to first, second, third, and fourth electrodes. Those skilled in the art will recognize that switching circuitry 138 can vary widely from that shown.

Figure 6:
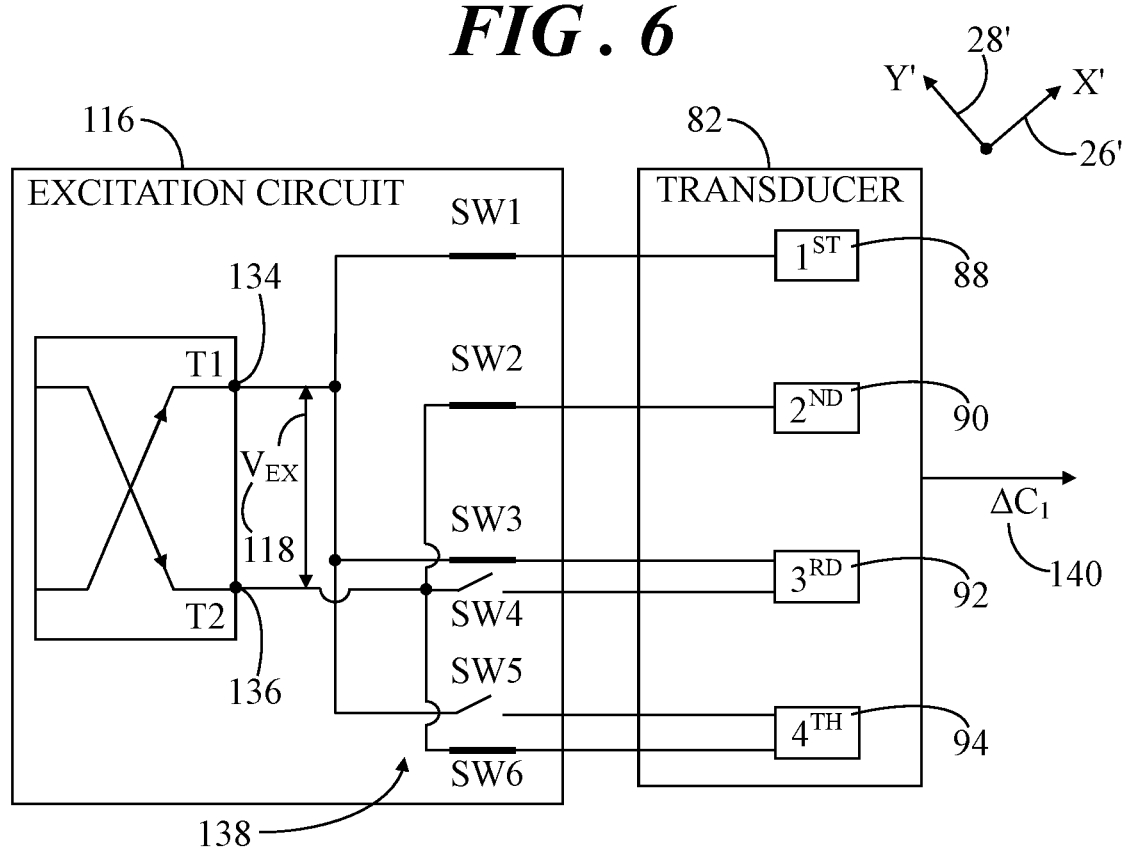
FIG. 6 shows a simplified schematic diagram for enabling the electrode connection configuration of FIG. 3.

Referring to FIGS. 3 and 6, FIG. 6 shows a simplified schematic diagram for enabling the electrode connection configuration of FIG. 3. During the first sensing period, first terminal 134 of excitation circuit 116 is coupled to first and third electrodes 88, 92 (exemplified by closure of SW1 and SW3), thereby forming connection 120 and second terminal 136 of excitation circuit 116 is coupled to second and fourth electrodes 90, 94 (exemplified by closure of SW2 and SW6), thereby forming connection 122. Under this connection configuration, transducer 82 is configured to produce a first composite output signal 140, $\Delta C_1$, representing the first displacement of movable mass 84 along X-axis 26 combined with the second displacement of movable mass along Y-axis 28 during the first sensing period. In other words, during the first sensing period, excitation voltage 118 may be applied concurrently on first/third electrodes 88, 92 and second/fourth electrodes 90, 94. First composite output signal 140 may be characterized as follows:

$$\Delta C_1 = (C_{X1} + C_{Y1}) - (C_{X2} + C_{Y2}) \qquad (15)$$

In expression (15), $C_{X1}$ represents first capacitance 102, $C_{Y1}$ represents third capacitance 110, $C_{X2}$ represents second capacitance 106, and $C_{Y2}$ represents fourth capacitance 114. Thus, first composite output signal 140 is proportional to a summation of first and third capacitances 102, 110 subtracted by a summation of second and fourth capacitances 106, 114. Sampling the combined electrodes effectively results in sensing the physical stimulus (e.g., acceleration) at a 45° angle. An acceleration vector of unity magnitude along a direction at a 45° angle can be decomposed into the sum of two orthogonal acceleration vectors along the X- and Y-directions, each having a magnitude equivalent to $1/\sqrt{2}$. Thus, when sensing at a 45° angle, the capacitance change 102, 104, 106, 108 has a magnitude equal to $(\Delta C/2) \times (1/\sqrt{2})$. Therefore, the output capacitance change resulting from the combination of the capacitance changes along X-axis 26 and Y-axis 28 as given by expression (15) is $\Delta C_1 = 4 \times (\Delta C/2) \times (1/\sqrt{2})$ more signal into measuring circuit 132 (FIG. 5).

Figure 7:
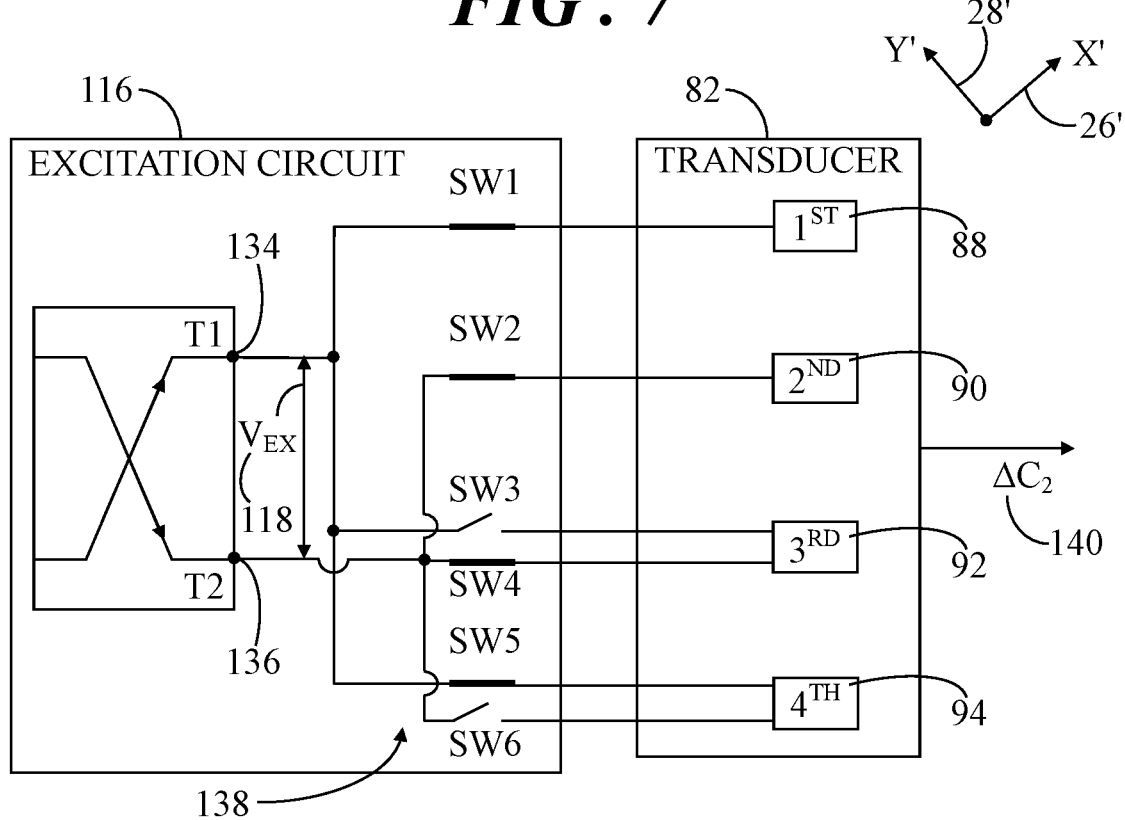
FIG. 7 shows a simplified schematic diagram for enabling the electrode connection configuration of FIG. 4.

Referring now to FIGS. 4 and 7, FIG. 7 shows a simplified schematic diagram for enabling the electrode connection configuration of FIG. 4. During the second sensing period, first terminal 134 of excitation circuit 116 is coupled to first and fourth electrodes 88, 94 (exemplified by closure of SW1 and SW5), thereby forming connection 124 and second terminal 136 of excitation circuit 116 is coupled to second and third electrodes 90, 92 (exemplified by closure of SW2 and SW4), thereby forming connection 126. Under this connection configuration, transducer 82 is configured to produce a second composite output signal 142, $\Delta C_2$, representing the first displacement of movable mass 84 along X-axis 26 combined with the second displacement of movable mass along Y-axis 28 during the second sensing period. In other words, during the second sensing period, excitation voltage 118 may be applied concurrently on first/fourth electrodes 88, 94 and second/third electrodes 90, 92. Second composite output signal 140 may be characterized as follows:

$$\Delta C_2 = (C_{X1} + C_{Y2}) - (C_{X2} + C_{Y1}) \quad (16)$$

In expression (16), $C_{X1}$ represents first capacitance 102, $C_{Y2}$ represents fourth capacitance 114, $C_{X2}$ represents second capacitance 106, and $C_{Y1}$ represents third capacitance 110. Thus, second composite output signal 142 is proportional to a summation of first and fourth capacitances 102, 114 subtracted by a summation of second and third capacitances 106, 110. Sampling the combined electrodes again effectively results in sensing the physical stimulus (e.g., acceleration) at a 45° angle. As such, for the reasoning discussed above, the output capacitance change resulting from the combination of the capacitance changes along X-axis 26 and Y-axis 28 as given by expression (16) is $\Delta C_2 = 4 \times (\Delta C/2) \times (1/\sqrt{2})$ more signal into measuring circuit 132 (FIG. 5).

Only two sensing periods are discussed in connection with the above figures, for simplicity. Thus, subsequent discussion relates to processing first and second composite output signals 140, 142 at measuring circuit 132 and concurrently utilizing both of first and second composite output signals 140, 142 to extract sense signals (discussed below) representative of acceleration force 32 along X-axis 26 and acceleration force 34 along Y-axis. However, it should be understood that there may be a plurality of sensing periods such that excitation circuit 116 is selectively connectable to first, second, third, and fourth electrodes 88, 90, 92, 94 during the plurality of successive sensing periods. During first instances of the plurality of sensing periods, first terminal 134 may be coupled to first and third electrodes 88, 92 and second terminal 136 may be coupled to second and fourth electrodes 90, 94. During second instances of the plurality of sensing periods, first terminal 134 may be coupled to first and fourth electrodes 88, 94 and second terminal 136 may be coupled to second and third terminals 90, 92. Individual first and second instances may occur in alternating sequence or any other suitable sequences. Transducer 82 may therefore produce additional composite output signals representing the displacement of movable mass 84 along X-axis 26 combined with the displacement of movable mass 84 along Y-axis 28 in response to acceleration forces 32, 34. These additional composite output signals along with first and second composite output signals 140, 142 may be utilized concurrently to extract sense signals representative of acceleration forces 32, 34.

Now returning back to FIG. 5, measuring circuit 132 is electrically coupled with transducer 82 for receiving and measuring first composite output signal 140 responsive to excitation voltage 118 during the first sensing period and for receiving and measuring second composite output signal 142 responsive to excitation voltage 118 during the second sensing period.

Measuring circuit 132 generally includes a signal chain used to process first and second composite output signals 140, 142 and to convert composite output signals 140, 142 into standard (Cartesian) axis values. A first stage of the signal chain includes a capacitance-to-voltage converter stage 144, abbreviated C2V herein, which sequentially receives first and second composite output signals 140, 142 from accelerometer 82, converts first composite output signal 140 to a first analog output voltage 146, $V_{A1}$, and converts second composite output signal 142 to a second analog output voltage 148, $V_{A2}$. A second stage of the signal chain is a gain stage 150, GAIN, connected to an output of C2V 144. Gain stage 150 sequentially receives first and second analog output voltages 146, 148, amplifies and applies a gain trim value to first analog output voltage 146 to produce a first trimmed analog output voltage 152, $V_{O1}$, and amplifies and applies the gain trim value to second analog output voltage 148 to produce a second trimmed analog output voltage 154, $V_{O2}$. Thus, although gain trim values may be applied, to first and second analog output voltages 146, 148, first and second trimmed analog output voltages 152, 154 remain composite output signals representing the displacement of movable mass 84 along both of X- and Y-axes 26, 28.

An analog-to-digital converter 156, ADC, follows gain stage 150. ADC 156 receives first and second trimmed analog output voltages 152, 154, converts first trimmed analog output voltage 152 to a first digital signal 158, $D_1$, and converts second trimmed analog output voltage 154 to a second digital signal 160, $D_2$. Thus, first digital signal 158 is representative of first composite output signal 140 measured in response to excitation signal 118 during the first sensing period and second digital signal 160 is representative of second composite signal 142 measured in response to excitation signal 118 during the second sensing period.

The analog gain, $G_{new}$, applied at gain stage 150 is set such that an input range for ADC 156 is used for a full scale acceleration on the combined X- and Y-axes 26, 28, which creates $\Delta C_{X1FS} + \Delta C_{Y1FS}$. Hence, the analog gain, $G_{new}$, can be approximately two times lower than the prior art configuration of FIG. 2. The analog gain, $G_{new}$, may be effectively decreased at gain stage 150 so that amplification of the noise from C2V 144 is commensurately reduced. An input signal at ADC 156 for the first sensing period can be characterized as follows:

$$V_{O1} = V_{EX} \times \frac{\Delta C_X + \Delta C_Y}{C_1} \times G_{new} \qquad (17)$$

Similarly, an input signal at ADC 156 for the second sensing period can be characterized as follows:

$$V_{O2} = V_{EX} \times \frac{\Delta C_X - \Delta C_Y}{C_1} \times G_{new} \qquad (18)$$

In some embodiments, an extraction circuit 162, AXIS EXTRACT, follows ADC 156. The outputs of the analog front end (e.g., output of gain stage 150) provide multiple axis information (e.g., two axes in this example). However, the information is not in a standard Cartesian axis form. Accordingly, after analog-to-digital conversion, signals from the first and second sensing periods (e.g., first and second digital signals 158, 160) are concurrently utilized to extract an acceleration signal corresponding to acceleration forces 32, 34 along each of X- and Y-axes 26, 28 (e.g., standard Cartesian axes). Combining of first and second digital signals 158, 160 to extract a digital acceleration value 164, $D_X$, corresponding to acceleration force 32 along X-axis 26 can be characterized as follows:

$$D_X = K_X(D_1 + D_2) \qquad (19)$$

Combining of first and second digital signals 158, 160 to extract a digital acceleration value 166, $D_Y$, corresponding to acceleration force 34 along Y-axis 28 can be characterized as follows:

$$D_Y = K_Y(D_1 - D_2) \qquad (20)$$

The coefficients $K_X$ and $K_Y$ represent the gain for the particular axis and may be assigned per standard physical or nonphysical stimulus during final test. The extraction of acceleration values is relatively straightforward and since it is done in the digital domain, there is no noise penalty. Digital acceleration signals 164, 166 may be further processed at a digital logic and trim stage 168. Thus, the output of measuring circuit 132 may be, for example, a first digital sense signal 170, $D_{OX}$, representing acceleration force 32 along X-axis 26 and a second digital sense signal 172, $D_{OY}$, representing acceleration force 34 along Y-axis 28. At the output of measuring circuit 132, first and second digital sense signals 170, 172 can be characterized as follows:

$$D_{OX} = V_{EX} \times \frac{\Delta C_X}{C_1} \times (2 \times G_{new}) \times G_{ADC} \times G_{DIGX} \qquad (21)$$

$$D_{OY} = V_{EX} \times \frac{\Delta C_Y}{C_1} \times (2 \times G_{new}) \times G_{ADC} \times G_{DIGY} \qquad (22)$$

For each of X-axis 26 and Y-axis 28, the digital gain value, $G_{DIG}$, applied at digital logic and trim stage 168 is set to reach the specified product sensitivity. $G_{DIGX}$ and $G_{DIGY}$ are each close to prior art values because the two times greater gain factor (2×G) from the axis extraction operation compensates for the two times smaller analog gain, discussed above.

Now referring to the SNR in this configuration. At an input of ADC 156, noise of each sensed signal can be characterized as follows:

$$N_{V_{O1}} = N_{C2V} \times \left(1 + \frac{C_m}{C_1}\right) \times G_{new} \qquad (23)$$

$$N_{V_{O2}} = N_{C2V} \times \left(1 + \frac{C_m}{C_1}\right) \times G_{new} \qquad (24)$$

The two noise components of expressions (23) and (24) share the same statistics, but are uncorrelated because C2V white noise is dominant, and the signals are sensed sequentially. The signals from the first and second sensing periods represent two-axis axis acceleration in a non-standard coordinate system. In some embodiments, these signals can be used in this form. In other embodiments, these signal may be digitally converted to acceleration in the standard coordinate system. In this example, after analog-to-digital conversion, the signals from the first and second sensing periods are combined as exemplified in expressions (19) and (20). Their noise power add since the noise components are uncorrelated, as follows:

$$N_{D_X} = \sqrt{N_{D_1}^2 + N_{D_2}^2} = \sqrt{2} \times N_{D_1} \text{ with} \qquad (25)$$

$$N_{D_1} = N_{C2V} \times \left(1 + \frac{C_m}{C_1}\right) \times G_{new} \times G_{ADC} \qquad (26)$$

$$N_{D_{OX}} = \sqrt{2} \times N_{C2V} \times \left(1 + \frac{C_m}{C_1}\right) \times G_{new} \times G_{ADC} \times G_{DIGX} \qquad (27)$$

Thus, the signal-to-noise ratio (SNR) for X-axis sensing can be characterized as follows:

$$SNR = \frac{D_{OX}}{N_{D_{OX}}} = \sqrt{2} \times \frac{V_{EX}}{N_{C2V}} \times \frac{\Delta C_X}{C_m + C_1} \qquad (28)$$

In a similar manner, the SNR for Y-axis sensing can be characterized as follows:

$$SNR = \frac{D_{OY}}{N_{D_{OY}}} = \sqrt{2} \times \frac{V_{EX}}{N_{C2V}} \times \frac{\Delta C_Y}{C_m + C_1} \qquad (29)$$

Accordingly, multiple sense axes (X-axis 26 and Y-axis 28 in this example) are sensed simultaneously at each sensing period. Additionally, each sense signal can be extracted from two or more sensing periods. Still further, the SNR improves by $\sqrt{2}$ on a two-axis sensing architecture, while current consumption remains largely unchanged since there are the same number of signal acquisitions (sensing periods).

Figure 8:
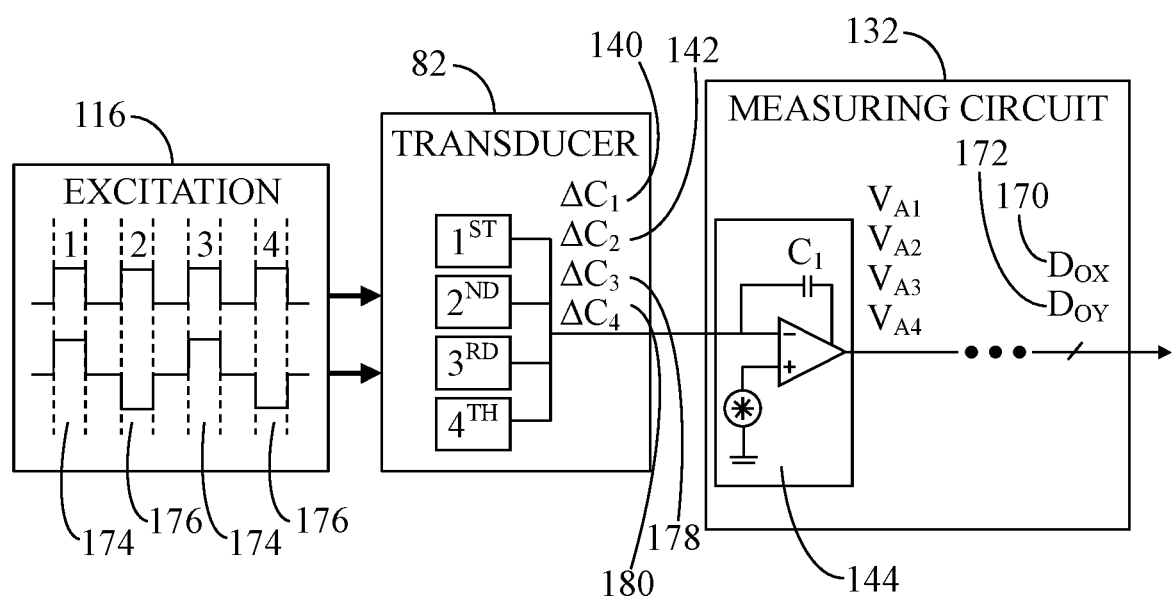
FIG. 8 shows a partial block diagram of the system of FIG. 2 demonstrating multiple sensing periods.

FIG. 8 shows a partial block diagram of system 130 demonstrating multiple sensing periods. As mentioned above, there may be a plurality of sensing periods such that excitation circuit 116 is selectively connectable to first, second, third, and fourth electrodes 88, 90, 92, 94 during the plurality of successive sensing periods. During first instances 174 of the plurality of sensing periods, first terminal 134 may be coupled to first and third electrodes 88, 92 and second terminal 136 may be coupled to second and fourth electrodes 90, 94 in connection configuration 81 (as demonstrated in FIG. 6). Thus, first instances 174 correspond with the electrode connection configuration of the first sensing period. During second instances 176 of the plurality of sensing periods, first terminal 134 may be coupled to first and fourth electrodes 88, 94 and second terminal 136 may be coupled to second and third terminals 90, 92 in connection configuration 83 (as demonstrated in FIG. 7). Thus, second instances 176 correspond with the electrode connection configuration of the second sensing period.

In this example, a total of four sensing periods are shown, with individual first and second instances 174, 176 occurring in alternating sequence. Transducer 82 may therefore produce additional composite output signals (a third composite output signal 178 and a fourth composite output signal 180 in this example) representing the displacement of movable mass 84 along X-axis 26 combined with the displacement of movable mass 84 along Y-axis 28 in response to acceleration forces 32, 34 (FIG. 3). These additional third and fourth composite output signals 178, 180 along with first and second composite output signals 140, 142 may be utilized concurrently to extract first and second digital sense signals 170, 172 representative of acceleration forces 32, 34. For example, expanding expressions (19) and (20) yields the following:

$$D_X = K_X(D_1 + D_2 + D_3 + D_4) \tag{30}$$

$$D_Y = K_Y(D_1 - D_2 + D_3 - D_4) \tag{31}$$

Combining digital signals processed from composite output signals 140, 142, 178, 180 as discussed above enables the extraction of a digital acceleration value, $D_X$, corresponding to acceleration force 32 along X-axis 26. Additionally, combining digital signals processed from composite output signals 140, 142, 178, 180 as discussed above enables the extraction of a digital acceleration value, $D_Y$, corresponding to acceleration force 34 along Y-axis 28. The digital acceleration values $D_X$ and $D_Y$ may be further processed at digital logic and trim stage 168 (FIG. 5) to yield first and second digital sense signals 170, 172.

FIG. 9 shows a partial block diagram of a sensor system 182 that includes a three-axis transducer 184 in accordance with another embodiment. That is, transducer 184 is configured to sense a physical stimulus (e.g., acceleration) along three orthogonal axes (e.g., X-axis 26, Y-axis 28, and Z-axis 30 shown in FIG. 3). Details of the structural configuration of transducer 184 are not provided herein for simplicity. Instead, it should be understood that transducer 184 may include one or more movable masses having a great variety of shapes and configurations capable of sensing along three orthogonal axes. Further, the quantity and/or configuration of the fixed and movable electrodes can vary in accordance with a particular design.

In this simplified configuration, transducer 184 includes first and second electrodes 186, 188 (labeled X1, X2) configured as a first differential electrode pair for detecting displacement of the movable mass(es) of transducer 184 along X-axis 26, third and fourth electrodes 190, 192 (labeled Y1, Y2) configured as a second differential electrode pair for detecting displacement of the movable mass(es) of transducer 184 along Y-axis 28, and fifth and sixth electrodes 194, 196 (labeled Z1, Z2) configured as a third differential electrode pair for detecting displacement of the movable mass(es) of transducer 184 along Z-axis 30.

Sensor system 182 includes an excitation circuit 198 configured to excite transducer 184 and a measuring circuit 200 for measuring the results from the excitation. Measuring circuit 200 may include a C2V 202 and subsequent processing stages, such as an analog gain stage 204 (GA), an ADC 206, an extraction circuit 208 (EXT), and a digital logic and trim stage 210 (DIG) similar to that described in connection with FIG. 5.

Referring to FIG. 10 in connection with FIG. 9, FIG. 10 shows a table 212 demonstrating multiple sensing periods and associated connection configurations of excitation circuit 198 to electrodes 186, 188, 190, 192, 194, 196 of transducer 184. In accordance with the embodiment of FIG. 9, excitation circuit 198 is selectively connectable to first, second, third, fourth, fifth, and sixth electrodes 186, 188, 190, 192, 194, 196 and is configured to provide an excitation voltage 214, $V_{EX}$. Excitation circuit 198 includes first and second terminals 216, 218 and excitation voltage 214 may be the differential voltage between first and second terminals 216, 218.

During a first sensing period 220, first terminal 216 (T1) is coupled to first, third, and fifth electrodes 186, 190, 194 (X1, Y1, Z1) and second terminal 218 (T2) is coupled to second, fourth, and sixth electrodes 188, 192, 196 (X2, Y2, Z2) in a first connection configuration 222. During a second sensing period 224, first terminal 216 (T1) is coupled to first, fourth, and fifth electrodes 186, 192, 194 (X1, Y2, Z1) and second terminal 218 (T2) is coupled to second, third, and sixth electrodes 188, 190, 196 (X2, Y1, Z2) in a second connection configuration 226. During a third sensing period 228, first terminal 216 (T1) is coupled to first, third, and sixth electrodes 186, 190, 196 (X1, Y1, Z2) and second terminal 218 (T2) is coupled to second, fourth, and fifth electrodes 188, 192, 194 (X2, Y2, Z1) in a third connection configuration 230. During a fourth sensing period 232, first terminal 216 (T1) is coupled to first, fourth, and sixth electrodes 186, 192, 196 (X1, Y2, Z2) and second terminal 218 (T2) is coupled to second, third, and fifth electrodes 188, 190, 194 (X2, Y1, Z1) in a fourth connection configuration 234.

Transducer 184 produces a first composite output signal 236, $\Delta C_1$, representing the displacement of the movable mass(es) along X-axis 26, combined with the displacement of movable mass(es) along Y-axis 28, and combined with the displacement of movable mass(es) along Z-axis during first sensing period 220. Similarly, transducer 184 produces a second composite output signal 238, $\Delta C_2$, representing the displacement of the movable mass(es) along X-axis 26, combined with the displacement of movable mass(es) along Y-axis 28, and combined with the displacement of movable mass(es) along Z-axis during second sensing period 224. Transducer 184 produces a third composite output signal 240, $\Delta C_3$, representing the displacement of the movable mass(es) along X-axis 26, combined with the displacement of movable mass(es) along Y-axis 28, and combined with the displacement of movable mass(es) along Z-axis during third sensing period 228. And, transducer 184 produces a fourth composite output signal 242, $\Delta C_4$, representing the displacement of the movable mass(es) along X-axis 26, combined with the displacement of movable mass(es) along Y-axis 28, and combined with the displacement of movable mass(es) along Z-axis during fourth sensing period 232.

Measuring circuit 200 is configured to sequentially receive and process each of first, second, third, and fourth composite output signals 236, 238, 240, 242 to produce a first digital sense signal 244, $D_{OX}$, indicative of the displacement of the movable mass(es) of transducer 184 along X-axis 26 in response to a physical stimulus along X-axis 26, to produce a second digital sense signal 246, $D_{OY}$, indicative of the displacement of the movable mass(es) of transducer 184 along Y-axis 28 in response to the physical stimulus along Y-axis 28, and to produce a third digital sense signal 248, $D_{OZ}$, indicative of the displacement of the movable mass(es) of transducer 184 along X-axis 30 in response to the physical stimulus along Z-axis 30. Per table 212, there are effectively four sense axes, i.e., four unique combinations of excitation and sampling of electrodes 186, 188, 190, 192, 194, 196.

FIG. 11 shows an illustrative representation of the "axes" being sampled by mathematical abstraction resulting from combined excitation of three-axis transducer 184 (FIG. 9). In this example, digital samples, $D_1$, $D_2$, $D_3$, $D_4$, correspond to first, second, third, and fourth composite output signals 236, 238, 240, 242 depicted in FIG. 10 from the multiple sensing periods 220, 224, 228, 232 depicted in FIG. 9. Since there are four unique combinations of excitation and sampling of electrodes 186, 188, 190, 192, 194, the four "axes" of information are not orthogonal, but are instead, approximately 109.5° apart. The outputs from the four sampling periods 220, 224, 228, 232 can be digitally converted and processed to extract the three Cartesian axis values. That is, the expressions presented above may be adapted to determine first, second, and third sense signals 244, 246, 258 from first, second, third, and fourth composite signals 236, 238, 240, 242, as follows:

$$V_{O1} = V_{EX} \times \frac{\Delta C_X + \Delta C_Y + \Delta C_Z}{C_1} \times G_{new} \quad (32)$$

$$V_{O2} = V_{EX} \times \frac{\Delta C_X - \Delta C_Y + \Delta C_Z}{C_1} \times G_{new} \quad (33)$$

$$V_{O3} = V_{EX} \times \frac{\Delta C_X + \Delta C_Y - \Delta C_Z}{C_1} \times G_{new} \quad (34)$$

$$V_{O4} = V_{EX} \times \frac{\Delta C_X - \Delta C_Y - \Delta C_Z}{C_1} \times G_{new} \quad (35)$$

The $G_{new}$ is set such that ADC input range is reached when a full scale acceleration is present on all three axes. Hence, the analog gain, $G_{new}$, is now approximately three times lower than the prior art configuration of FIG. 2. After analog-to-digital conversion, the digital samples, $D_1$, $D_2$, $D_3$, $D_4$, from the four sensing periods 220, 224, 228, 232 can be combined to extract the physical stimulus (e.g., acceleration) signal along each axis as follows:

$$D_X = K_X(D_1 + D_2 + D_3 + D_4) \quad (36)$$

$$D_Y = K_Y(D_1 - D_2 + D_3 - D_4) \quad (37)$$

$$D_Z = K_Z(D_1 + D_2 - D_3 - D_4) \quad (38)$$

Again, the extraction is relatively straightforward and since it is done in the digital domain, there is no noise penalty. At the output of measuring circuit 200, first, second and third sense signals 244, 246, 248 can be characterized as follows:

$$D_{OX} = V_{EX} \times \frac{\Delta C_X}{C_1} \times (4 \times G_{new}) \times G_{ADC} \times G_{DIGX} \quad (39)$$

$$D_{OY} = V_{EX} \times \frac{\Delta C_Y}{C_1} \times (4 \times G_{new}) \times G_{ADC} \times G_{DIGY} \quad (40)$$

$$D_{OZ} = V_{EX} \times \frac{\Delta C_Y}{C_1} \times (4 \times G_{new}) \times G_{ADC} \times G_{DIGY} \quad (41)$$

For each of X-axis 26, Y-axis 28, and Z-axis 30, the digital gain value, $G_{DIG}$, applied at digital logic and trim stage 210 is approximately three-quarters of the value for the prior art configuration of FIG. 2 to reach the product sensitivity due to the four times factor from the axis extraction operation and the one-third factor applied on the analog gain, $G_{new}$, to ensure that the ADC input full scale is not exceeded.

Now referring to the SNR in this configuration. At an input of ADC 206, noise of each sensed signal can be characterized as follows:

$$N_{V_{O1,2,3,4}} = N_{C2V} \times \left(1 + \frac{C_m}{C_1}\right) \times G_{new} \quad (42)$$

The noise power of the digital samples, $D_1$, $D_2$, $D_3$, $D_4$, add since the noise components are uncorrelated, as follows:

$$N_{D_X} = \sqrt{N_{D_1}^2 + N_{D_2}^2 + N_{D_3}^2 + N_{D_4}^2} = 2 \times N_{D_1} \text{ with} \quad (43)$$

$$N_{D_1} = N_{C2V} \times \left(1 + \frac{C_m}{C_1}\right) \times G_{new} \times G_{ADC} \quad (44)$$

$$N_{D_{OX}} = 2 \times N_{C2V} \times \left(1 + \frac{C_m}{C_1}\right) \times G_{new} \times G_{ADC} \times G_{DIGX} \quad (45)$$

Thus, the signal-to-noise ratios (SNR) for X-axis, Y-axis, and Z-axis sensing can be characterized as follows:

$$SNR = \frac{D_{OX}}{N_{D_{OX}}} = 2 \times \frac{V_{EX}}{N_{C2V}} \times \frac{\Delta C_X}{C_m + C_1} \quad (46)$$

$$SNR = \frac{D_{OY}}{N_{D_{OY}}} = 2 \times \frac{V_{EX}}{N_{C2V}} \times \frac{\Delta C_Y}{C_m + C_1} \quad (47)$$

$$SNR = \frac{D_{OZ}}{N_{D_{OZ}}} = 2 \times \frac{V_{EX}}{N_{C2V}} \times \frac{\Delta C_Y}{C_m + C_1} \quad (48)$$

Accordingly, multiple sense axes (X-axis 26, Y-axis 28, and Z-axis in this example) are sensed simultaneously at each sensing period. Additionally, each sense signal can be extracted from digital samples from four sensing periods. Still further, the SNR improves by two times on all three axes. However, current consumption may increase by approximately thirty-three percent due to the addition of a fourth signal acquisition slot (e.g., a fourth sensing period).

Figure 12:
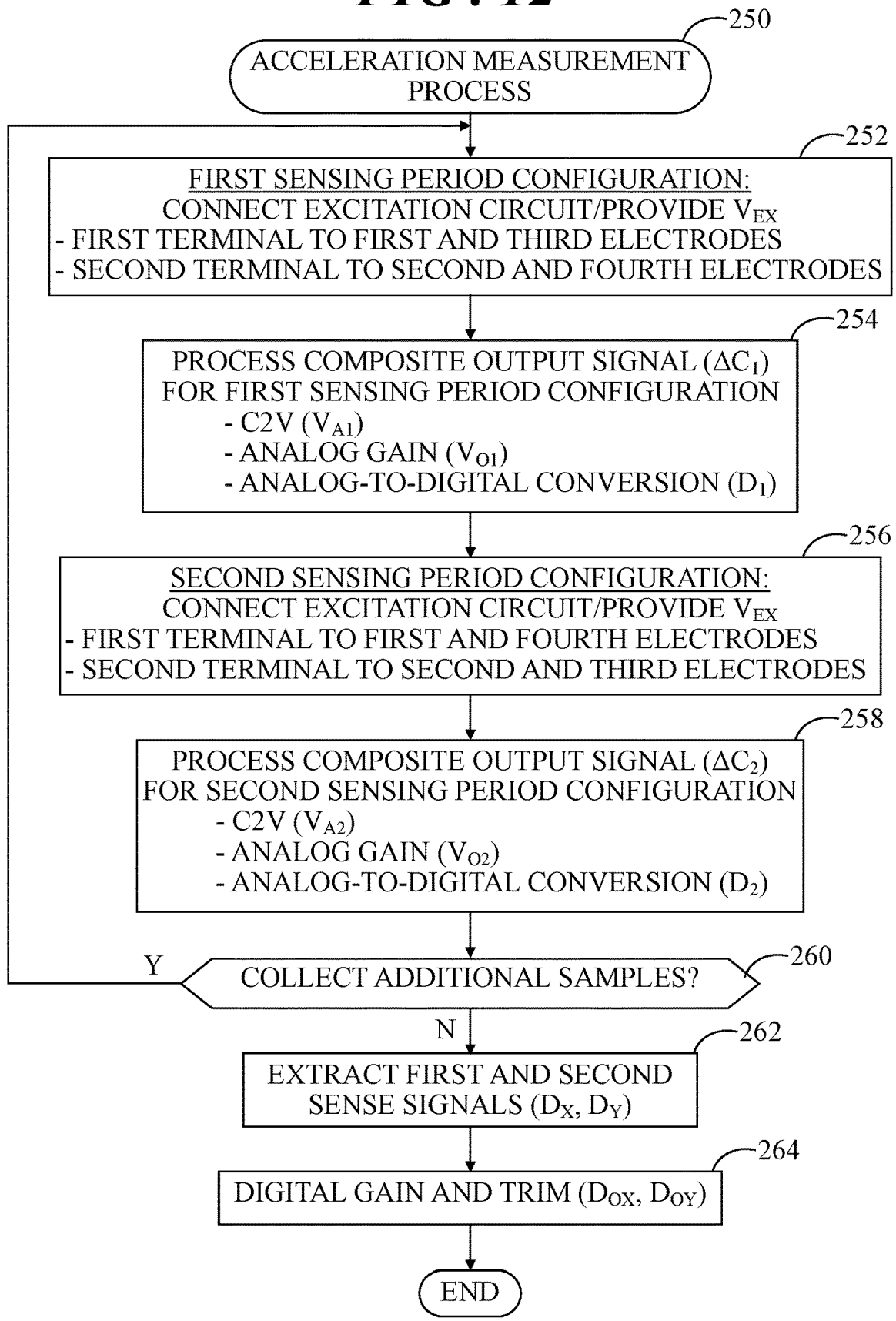
FIG. 12 shows a flowchart of a measurement process in accordance with another embodiment.

Referring now to FIG. 12, FIG. 12 shows a flowchart of a measurement process 250 in accordance with another embodiment. Measurement process 250 may be implemented using sensor system 130 (FIG. 5) that includes the dual axis transducer (e.g., accelerometer 82). Accordingly, reference should be made concurrently to FIG. 5 in connection with the following description. However, it should be understood that measurement process 250 may be expanded to be implemented with sensor system (FIG. 9) that includes the three-axis transducer (e.g., accelerometer 184). Additionally, measurement process 250 demonstrates a single measurement cycle for simplicity. It should be apparent that execution of measurement process 250 may be continuously repeated for a multiplicity of measurement cycles.

Measurement process 250 includes a number of process blocks, each of which will be described in detail below. Each process block generically illustrated in FIG. 12 may entail a single process or multiple sub-processes. Furthermore, the process blocks illustrated in FIG. 12 and described below are provided by way of non-limiting example. In alternative embodiments of acceleration measurement process 250, additional process blocks may be performed, certain process blocks may be omitted, and/or the illustrated process blocks may be performed in alternative sequences.

At a block 252, sensor system 130 is configured for a first sensing period electrode connection configuration. In particular, first terminal 134 of excitation circuit 116 is coupled to first and third electrodes 88, 92, second terminal 136 of excitation circuit 116 is coupled to second and fourth electrodes 90, 94 (as demonstrated in FIG. 3), and excitation voltage 118 is provided. At a block 254, first composite output signal 140, $\Delta C_1$, that is produced by transducer 82 is received at measuring circuit 132 and processed for the first sensing period, as discussed above.

At a block 256, sensor system 130 is configured for a second sensing period electrode connection configuration. In particular, first terminal 134 of excitation circuit 116 is coupled to first and fourth electrodes 88, 94, second terminal 136 of excitation circuit 116 is coupled to second and third electrodes 90, 92, and excitation voltage 118 is provided. At a block 258, second composite output signal 142, $\Delta C_2$, that is produced by transducer is received at measuring circuit 132 and processed for the second sensing period, as discussed above. Accordingly following execution of process blocks 254 and 258, first and second digital signals 158, 160 ($D_1$, $D_2$) are produced.

Process control continues with a query block 260 to determine whether additional samples are to be collected and processed for subsequent sensing periods. When additional samples are to be collected, process control loops back to repeat process blocks 252, 254, 256, 258. However, when a determination is made at query block 260, that no further samples are to be collected, process control can continue with a block 262.

At block 262, first and second sense signals 164, 166 ($D_X$, $D_Y$) may be extracted from first and second digital signals 158, 160 ($D_1$, $D_2$) in some embodiments. Process 250 may continue with a block 264 at which first and second sense signals 164, 166 ($D_X$, $D_Y$) may be subject to digital gain and trim at digital logic and trim stage 168, and first and second digital sense signals 170, 172 ($D_{OX}$, $D_{OY}$) may be output from sensor system 130. Thereafter, process 250 ends for a single measurement cycle. However, as indicated above, execution of measurement process 250 may be continuously repeated for a multiplicity of measurement cycles.

Embodiments described herein entail systems and methodology for combined sampling of the multiple sense axes of an inertial sensor, such as a microelectromechanical systems (MEMS) capacitive accelerometer. More particularly, systems and methodology entail providing electrodes of a transducer with an excitation voltage in such a way that information from all orthogonal sense axes is contained in a composite output signal from the transducer during each measurement cycle (e.g., sensing period). The composite output signal may then be converted into standard (Cartesian) axis values. The inclusion of sense information of every axis in every sensing period may yield significant improvements in signal-to-noise ratio (SNR) without a significant increase in current consumption. Additionally, the combined sense axis sampling technique can be implemented on any of a variety of multiple sense axis inertial sensor designs. Therefore, improvements in SNR are achieved without increasing the inertial sensor die size and without changing the structure of the inertial sensor configuration.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

The present disclosure extends to the following series of lettered clauses:

A. The method of claim 14 wherein the operation of utilizing the first and second digital signals comprises: extracting the first sense signal by summation of the first and second digital signals; and extracting the second sense signal by subtraction of the second digital signal from the first digital signal.

B. The method of any of claims 12 to 15, or clause A, further comprising: during multiple occurrences of a plurality of sensing periods, coupling the first terminal of the excitation circuit to the first and third electrodes and the second terminal of the excitation circuit to the second and fourth electrodes; during multiple other occurrences of the plurality of sensing periods, coupling the first terminal of the excitation circuit to the first and fourth electrodes and the second terminal of the excitation circuit to the second and third electrodes; receiving additional composite output signals from the transducer at the measuring circuit, the additional composite output signals representing the first displacement of the movable mass along the first axis combined with the second displacement of the movable mass along the second axis during the plurality of sensing periods; concurrently utilizing the first and second composite output signals and the additional composite output signals to extract the first and second sense signals.

C. The method of any of claims 12 to 15, or clauses A or B, wherein the transducer is further configured to sense the physical stimulus along a third axis, the third axis being orthogonal to each of the first and second axes, the transducer further including fifth and sixth electrodes that are immovable relative to the movable mass, the fifth and sixth electrodes being configured as a third differential electrode pair for detecting a third displacement of the movable mass along the third axis in response to the physical stimulus, and wherein: the method further comprises: during the first sensing period, additionally coupling the first terminal of the excitation circuit to the fifth electrode and additionally coupling the second terminal of the excitation circuit to the sixth; during the second sensing period, additionally coupling the first terminal to the fifth electrode and the second terminal to the sixth electrode; during a third sensing period, coupling the first terminal to the first, third, and sixth electrodes and coupling the second terminal to second, fourth, and fifth electrodes; during a fourth sensing period, coupling the first terminal to the first, fourth, and sixth electrodes and coupling the second terminal to second, third, and fifth electrodes; the receiving operation further comprises receiving third and fourth composite output signals, each of the first, second, third, and fourth composite output signals representing the first displacement of the movable mass along the first axis, combined with the second displacement of the movable mass along the second axis, and combined with the third displacement of the movable mass along the third axis during each of the first, second, third, and fourth sensing periods; and the concurrently utilizing operation further comprises concurrently utilizing the first, second, third, and fourth composite output signals to extract the first and second sense signals, and to further extract a third sense signal indicative of the third displacement of the movable mass along the third axis.

D A sensor system comprising: a transducer configured to sense a physical stimulus along a first axis and a second axis, the second axis being orthogonal to the first axis, the transducer including; a movable mass configured to react to the physical stimulus; first and second electrodes that are immovable relative to the movable mass, the first and second electrodes being configured as a first differential electrode pair for detecting a first displacement of the movable mass along the first axis in response to the physical stimulus, the transducer being configured to produce a first signal component between the movable mass and the first electrode and a second signal component between the movable mass and the second electrode; and third and fourth electrodes that are immovable relative to the movable mass, the third and fourth electrodes being configured as a second differential electrode pair for detecting a second displacement of the movable mass along the second axis in response to the physical stimulus, the transducer being configured to produce a third signal component between the movable mass and the third electrode and a fourth signal component between the movable mass and the fourth electrode; and an excitation circuit selectively connectable to the first, second, third, and fourth electrodes and configured to provide an excitation voltage, wherein: during a first sensing period, a first terminal of the excitation circuit is coupled to the first and third electrodes and a second terminal of the excitation circuit is coupled to the second and fourth electrodes such that the transducer produces a first composite output signal representing the first displacement of the movable mass along the first axis combined with the second displacement of the movable mass along the second axis during the first sensing period, the first composite output signal being proportional to a summation of the first and third signal components subtracted by a summation of the second and fourth signal components; and during a second sensing period, the first terminal of the excitation circuit is coupled to the first and fourth electrodes and the second terminal of the excitation circuit is coupled to the second and third electrodes such that the transducer produces a second composite output signal representing the first displacement of the movable mass along the first axis combined with the second displacement of the movable mass along the second axis during the second sensing period, the second composite output signal being proportional to a summation of the first and fourth signal components subtracted by a summation of the second and third signal components; and a measuring circuit electrically coupled with the transducer for measuring the first composite output signal from the transducer responsive to the excitation voltage during the first sensing period and for measuring the second composite output signal from the transducer responsive to the excitation voltage during the second sensing period.

E. The sensor system of clause 19 wherein the measuring circuit comprises an extraction circuit configured to concurrently utilize the first and second composite output signals to extract a first sense signal indicative of the first displacement of the movable mass along the first axis and to extract a second sense signal indicative of the second displacement of the movable mass along the second axis.

The invention claimed is:

1. A sensor system comprising:
a transducer configured to sense a physical stimulus along a first axis and a second axis, the second axis being orthogonal to the first axis, the transducer including:
a movable mass configured to react to the physical stimulus;
first and second electrodes that are immovable relative to the movable mass, the first and second electrodes being configured as a first differential electrode pair for detecting a first displacement of the movable mass along the first axis in response to the physical stimulus; and
third and fourth electrodes that are immovable relative to the movable mass, the third and fourth electrodes being configured as a second differential electrode pair for detecting a second displacement of the movable mass along the second axis in response to the physical stimulus; and
an excitation circuit selectively connectable to the first, second, third, and fourth electrodes and configured to provide an excitation voltage, wherein:
during a first sensing period, a first terminal of the excitation circuit is coupled to the first and third electrodes and a second terminal of the excitation circuit is coupled to the second and fourth electrodes in a first connection configuration; and
during a second sensing period, the first terminal of the excitation circuit is coupled to the first and fourth electrodes and the second terminal of the excitation circuit is coupled to the second and third electrodes in a second connection configuration;
wherein the transducer is configured to produce a first composite output signal, the first composite output signal representing the first displacement of the movable mass along the first axis combined with the second displacement of the movable mass along the second axis during the first sensing period;
wherein the transducer is configured to produce a second composite output signal representing the first displacement of the movable mass along the first axis combined with the second displacement of the movable mass along the second axis during the second sensing period;
wherein the sensor system further comprises a measuring circuit electrically coupled with the transducer for measuring the first composite output signal from the transducer responsive to the excitation voltage during the first sensing period and for measuring the second composite output signal from the transducer responsive to the excitation voltage during the second sensing period;
wherein the measuring circuit comprises an extraction circuit configured to concurrently utilize the first and second composite output signals to extract a first sense signal indicative of the first displacement of the movable mass along the first axis and to extract a second sense signal indicative of the second displacement of the movable mass along the second axis;
wherein the transducer is further configured to sense the physical stimulus along a third axis, the third axis being orthogonal to each of the first and second axes:

wherein the transducer further includes:
fifth and sixth electrodes that are immovable relative to the movable mass, the fifth and sixth electrodes being configured as a third differential electrode pair for detecting a third displacement of the movable mass along the third axis in response to the physical stimulus;
wherein the excitation circuit is further selectively connectable to the fifth and sixth electrodes to provide the excitation voltage, wherein:
during the first sensing period, the first terminal is additionally coupled to the fifth electrode and the second terminal is additionally coupled to the sixth electrode in the first connection configuration;
during the second sensing period, the first terminal is additionally coupled to the fifth electrode and the second terminal is additionally coupled to the sixth electrode in the second connection configuration;
during a third sensing period, the first terminal is coupled to the first, third, and sixth electrodes, and the second terminal is coupled to the second, fourth, and fifth electrodes in a third connection configuration; and
during a fourth sensing period, the first terminal is coupled to the first, fourth, and sixth electrodes, and the second terminal is coupled to second, third, and fifth electrodes in a fourth connection configuration;
wherein the transducer is configured to produce a corresponding one of the first composite output signal, the second composite output signal, a third composite output signal, and a fourth composite output signal, each of which represents the first displacement of the movable mass along the first axis, combined with the second displacement of the movable mass along the second axis, and combined with the third displacement of the movable mass along the third axis during each of the first, second, third, and fourth sensing periods; and
wherein the extraction circuit is further configured to concurrently utilize the first, second, third, and fourth composite output signals to extract the first and second sense signals, and to further extract a third sense signal indicative of the third displacement of the movable mass along the third axis.

2. The sensor system of claim 1 wherein:
the transducer is configured to produce a first signal component between the movable mass and the first electrode, a second signal component between the movable mass and the second electrode, a third signal component between the movable mass and the third electrode, and a fourth signal component between the movable mass and the fourth electrode, wherein:
the first composite output signal is proportional to a summation of the first and third signal components subtracted by a summation of the second and fourth signal components during the first sensing period; and
the second composite output signal is proportional to a summation of the first and fourth signal components subtracted by a summation of the second and third signal components during the second sensing period.

3. The sensor system of claim 1 wherein the measuring circuit further comprises an analog-to-digital converter (ADC) circuit configured to receive the first composite output signal and provide a first digital signal representative of the first composite output signal, and the ADC circuit being further configured to receive the second composite output signal and provide a second digital signal representative of the second composite output signal, and wherein the extraction circuit is configured to utilize the first and second digital signals to extract the first and second sense signals.

4. The sensor system of claim 3 wherein the measuring circuit further comprises a gain circuit interconnected between the transducer and the ADC circuit, the gain circuit being configured to apply a gain value to each of the first and second composite output signals, the gain value corresponding to a full scale input range of the ADC circuit.

5. The sensor system of claim 3 wherein the extraction circuit is configured to receive the first and second digital signals from the ADC circuit, extract the first sense signal by summation of the first and second digital signals, and extract the second sense signal by subtraction of the second digital signal from the first digital signal.

6. The sensor system of claim 1 wherein:
the excitation circuit is selectively connectable to the first, second, third, and fourth electrodes during a plurality of sensing periods, wherein:
during first instances of the plurality of sensing periods, the first terminal of the excitation circuit is coupled to the first and third electrodes and the second terminal of the excitation circuit is coupled to the second and fourth electrodes in the first connection configuration;
during second instances of the plurality of sensing periods, the first terminal of the excitation circuit is coupled to the first and fourth electrodes and the second terminal of the excitation circuit is coupled to the second and third electrodes in the second connection configuration; and
the transducer is configured to produce additional composite output signals representing the first displacement of the movable mass along the first axis combined with the second displacement of the movable mass along the second axis during the first and second instances of the plurality of sensing periods; and
the extraction circuit is further configured to concurrently utilize the first and second composite output signals and the additional composite output signals to extract the first and second sense signals.

7. The sensor system of claim 1 wherein the first and second electrodes are parallel to one another, the third and fourth electrodes are parallel to one another, and the third and fourth electrodes are arranged orthogonal to the first and second electrodes.

8. The sensor system of claim 1 wherein:
the transducer is a capacitive transducer;
the movable mass and the first electrode are configured to establish a first capacitor having a first capacitance;
the movable mass and the second electrode are configured to establish a second capacitor having a second capacitance, wherein the first displacement changes the first capacitance and the first displacement changes the second capacitance in an opposite direction with respect to the first capacitance;
the movable mass and the third electrode are configured to establish a third capacitor having a third capacitance;
the movable mass and the fourth electrode are configured to establish a fourth capacitor having a fourth capacitance, wherein the second displacement changes the third capacitance and the second displacement changes the fourth capacitance in an opposite direction with respect to the third capacitance.

9. A method for measuring a physical stimulus using a system that includes a transducer configured to sense the physical stimulus along a first axis and a second axis, the second axis being orthogonal to the first axis, the transducer including a movable mass configured to react to the physical stimulus, first and second electrodes that are immovable relative to the movable mass, the first and second electrodes being configured as a first differential electrode pair for detecting a first displacement of the movable mass along the first axis in response to the physical stimulus, and third and fourth electrodes that are immovable relative to the movable mass, the third and fourth electrodes being configured as a second differential electrode pair for detecting a second displacement of the movable mass along the second axis in response to the physical stimulus, the method comprising:

implementing an excitation circuit to provide an excitation voltage;

during a first sensing period, coupling a first terminal of the excitation circuit to the first and third electrodes and a second terminal of the excitation circuit to the second and fourth electrodes;

during a second sensing period, coupling the first terminal of the excitation circuit to the first and fourth electrodes and the second terminal of the excitation circuit to the second and third electrodes;

receiving a first and second composite output signals from the transducer at a measuring circuit, the first composite output signal representing the first displacement of the movable mass along the first axis combined with the second displacement of the movable mass along the second axis during the first sensing period and the second composite output signal representing the first displacement of the movable mass along the first axis combined with the second displacement of the movable mass along the second axis during the second sensing period; and concurrently utilizing the first and second composite output signals to extract a first sense signal indicative of the first displacement of the movable mass and to extract a second sense signal indicative of the second displacement of the movable mass;

wherein the transducer is further configured to sense the physical stimulus along the third axis, the third axis being orthogonal to each of the first and second axes, the transducer further including fifth and sixth electrodes that are immovable relative to the movable mass, the fifth and sixth electrodes being configured as a third differential electrode pair for detecting a third displacement of the movable mass along the third axis in response to the physical stimulus;

wherein the method further comprises:

during the first sensing period, additionally coupling the first terminal of the excitation circuit to the fifth electrode and additionally coupling the second terminal of the excitation circuit to the sixth;

during the second sensing period, additionally coupling the first terminal to the fifth electrode and the second terminal to the sixth electrode;

during a third sensing period, coupling the first terminal to the first, third, and sixth electrodes and coupling the second terminal to second, fourth, and fifth electrodes; and during a fourth sensing period, coupling the first terminal to the first, fourth, and sixth electrodes and coupling the second terminal to second, third, and fifth electrodes;

wherein the receiving operation further comprises receiving the third and fourth composite output signals, each of the first, second, third, and fourth composite output signals representing the first displacement of the movable mass along the first axis, combined with the second displacement of the movable mass along the second axis, and combined with the third displacement of the movable mass along the third axis during each of the first, second, third, and fourth sensing periods; and wherein the method further comprises concurrently utilizing the third and fourth composite output signals with the first and second composite output signals to extract the first and second sense signals; and wherein the method further comprises concurrently utilizing the first, second, third, and fourth composite output signals to extract a third sense signal indicative of the third displacement of the movable mass along the third axis.

10. The method of claim 9 wherein the transducer is configured to produce a first signal component between the movable mass and the first electrode, a second signal component between the movable mass and the second electrode, a third signal component between the movable mass and the third electrode, and a fourth signal component between the movable mass and the fourth electrode, and wherein:

the first composite output signal is proportional to a summation of the first and third signal components subtracted by a summation of the second and fourth signal components during the first sensing period; and the second composite output signal is proportional to a summation of the first and fourth signal components subtracted by a summation of the second and third signal components during the second sensing period.

11. The method of claim 9 further comprising:

receiving the first composite output signal at an analog-to-digital converter (ADC) circuit;

providing, from the ADC circuit, a first digital signal representative of the first composite output signal;

receiving the second composite output signal at the ADC circuit;

providing, from the ADC circuit, a second digital signal representative of the second composite output signal; and utilizing the first and second digital signals at the extraction circuit to extract the first and second sense signals.

12. The method of claim 11 wherein prior to receiving the first and second composite output signals at the ADC circuit, the method further comprises applying a gain value to each of the first and second composite output signals, the gain value corresponding to a full scale input range of the ADC.

13. The method of claim 11 wherein the operation of utilizing the first and second digital signals comprises:

extracting the first sense signal by summation of the first and second digital signals; and extracting the second sense signal by subtraction of the second digital signal from the first digital signal.

14. The method of claim 9 further comprising:

during multiple occurrences of a plurality of sensing periods, coupling the first terminal of the excitation circuit to the first and third electrodes and the second terminal of the excitation circuit to the second and fourth electrodes;

during multiple other occurrences of the plurality of sensing periods, coupling the first terminal of the excitation circuit to the first and fourth electrodes and the second terminal of the excitation circuit to the second and third electrodes;

receiving additional composite output signals from the transducer at the measuring circuit, the additional composite output signals representing the first displacement of the movable mass along the first axis combined with the second displacement of the movable mass along the second axis during the plurality of sensing periods; and concurrently utilizing the first and second composite output signals and the additional composite output signals to extract the first and second sense signals.

\* \* \* \* \*